(12) United States Patent
Rogowski et al.

(10) Patent No.: US 11,568,103 B2
(45) Date of Patent: Jan. 31, 2023

(54) METHOD AND SYSTEM FOR REDUCING OUTPUT OF RESERVOIR SIMULATION DATA

(71) Applicant: SAUDI ARABIAN OIL COMPANY, Dhahran (SA)

(72) Inventors: Marcin Rogowski, Dhahran (SA); Michel Cancelliere, Dhahran (SA); Suha Naim Kayum, Dhahran (SA)

(73) Assignee: SAUDI ARABIAN OIL COMPANY, Dhahran (SA)

( * ) Notice: Subject to any disclaimer, the term of this patent is extended or adjusted under 35 U.S.C. 154(b) by 301 days.

(21) Appl. No.: 16/833,387

(22) Filed: Mar. 27, 2020

(65) Prior Publication Data

US 2021/0303753 A1    Sep. 30, 2021

(51) Int. Cl.
*G06F 30/20*    (2020.01)
*G06T 17/00*    (2006.01)
*H04N 19/70*    (2014.01)

(52) U.S. Cl.
CPC ............ *G06F 30/20* (2020.01); *G06T 17/00* (2013.01); *H04N 19/70* (2014.11)

(58) Field of Classification Search
CPC ........ G01V 11/00; G06F 30/20; H04N 19/70; G06T 17/00
See application file for complete search history.

(56) References Cited

U.S. PATENT DOCUMENTS 7,907,069 B2   3/2011   Oberdorfer
8,521,837 B2   8/2013   Badheka et al.
9,797,225 B2   10/2017  Chavez et al.
2006/0061584 A1   3/2006   Kristiansen
(Continued)

FOREIGN PATENT DOCUMENTS

AU    716417 B2    2/2000
CN    101476458 A  7/2009

OTHER PUBLICATIONS

King, Michael J. et al., "Reservoir Modeling: From RESCUE To RESQML", SPE 135280, SPE Reservoir Evaluation and Engineering, Society of Petroleum Engineers, Apr. 2012, pp. 127-138 (12 pages).
(Continued)

*Primary Examiner* — Thai Q Phan
(74) *Attorney, Agent, or Firm* — Osha Bergman Watanabe & Burton LLP

(57) ABSTRACT

A method may include generating three-dimensional (3D) reservoir simulation data regarding a subsurface formation. The 3D reservoir simulation data may correspond to a plurality of reservoir properties at a predetermined timestep within a reservoir simulation. The method may include generating a 3D pixel dataset using the 3D reservoir simulation data. Each pixel of the 3D pixel dataset may be determined based on a plurality of reservoir property values. Each pixel of the 3D pixel dataset may include a red value, a green value, and a blue value that corresponds to three different reservoir property values out of the plurality of reservoir property values. The method may include generating a two-dimensional (2D) pixel dataset using the 3D pixel dataset. The 2D pixel dataset may correspond to a single video frame within various video frames.

20 Claims, 19 Drawing Sheets

(10 of 19 Drawing Sheet(s) Filed in Color)

(56) References Cited

U.S. PATENT DOCUMENTS

| | | | | |
|---|---|---|---|---|
| 2007/0014435 A1* | 1/2007 | Mirowski | ............. | G01V 11/00 |
| | | | | 382/109 |
| 2009/0164182 A1* | 6/2009 | Pedersen | ................ | G01V 11/00 |
| | | | | 703/2 |
| 2009/0262603 A1* | 10/2009 | Hurley | ................... | G01V 11/00 |
| | | | | 702/11 |
| 2012/0004849 A1 | 1/2012 | Aarre | | |
| 2014/0052377 A1 | 2/2014 | Downie | | |
| 2018/0061063 A1* | 3/2018 | Buyukozturk | .......... | G06T 7/262 |
| 2019/0082185 A1* | 3/2019 | Satavalekar | ......... | H04N 19/186 |
| 2020/0348430 A1* | 11/2020 | Tan | ....................... | G01V 1/303 |
| 2021/0055439 A1* | 2/2021 | Schlafli | ................... | G06T 17/20 |

OTHER PUBLICATIONS

Berres, Anne S. et al.: "Video Compression for Ocean Simulation Image Databases", Jan. 1, 2017 (6 pages).
International Search Report issued for PCT/US2020/030229, dated Jul. 10, 2020 (3 pages).
Written Opinion issued for PCT/2020/030229, dated Jul. 10, 2020 (10 pages).

* cited by examiner

METHOD AND SYSTEM FOR REDUCING OUTPUT OF RESERVOIR SIMULATION DATA

BACKGROUND

Reservoir simulation data is typically stored uncompressed because while compressing the data may reduce the data's storage footprint, data compressed using traditional compression algorithms is unreachable unless the data is decompressed. As such, reservoir simulation data remains unavailable and unobservable unless the data is decompressed. Storing uncompressed and decompressed reservoir simulation data leads to increased storage requirements for any data including reservoirs characteristics and properties. In the case of reservoir simulation data illustrating oil saturation or pressure, petabytes of distributed storage may be required to adequately save the entirety of this information for a specific drilling site. Further, additional resources may be required if output frequency is increased, or model sizes relating to the stored data are increased. Currently, traditional compression algorithms (i.e., ZIP, gzip, or bzip2) are typically applied after the simulation is finished, and make the data unreadable without decompressing. Thus, there are currently no alternatives available that compress reservoir simulation data while the simulation is ongoing and that reduce output of reservoir simulation data while enabling observation and study of the reservoir simulation data.

SUMMARY

In general, in one aspect, embodiments disclosed herein relate to a method for reducing output of reservoir simulation data. The method includes generating three-dimensional (3D) reservoir simulation data regarding a subsurface formation. The 3D reservoir simulation data corresponds to a plurality of reservoir properties at a predetermined timestep within a reservoir simulation. The method includes generating a 3D pixel dataset using the 3D reservoir simulation data. Each pixel of the 3D pixel dataset is determined based on a plurality of reservoir property values. Each pixel of the 3D pixel dataset includes a red value, a green value, and a blue value to represent up to three different reservoir property values. The method includes generating a two-dimensional (2D) pixel dataset using the 3D pixel dataset. The 2D pixel dataset corresponds to a single video frame within a plurality of video frames. The method includes generating a compressed video dataset using the plurality of video frames and a video compression algorithm.

In general, in one aspect, embodiments disclosed herein relate to a computing system for reducing output of reservoir simulation data. The computing system includes a processor and a memory coupled to the processor. The memory includes functionality for generating three-dimensional (3D) reservoir simulation data regarding a subsurface formation. The 3D reservoir simulation data corresponds to a plurality of reservoir properties at a predetermined timestep within a reservoir simulation. The memory includes functionality for generating a 3D pixel dataset using the 3D reservoir simulation data. Each pixel of the 3D pixel dataset is determined based on a plurality of reservoir property values. Each pixel of the 3D pixel dataset includes a red value, a green value, and a blue value to represent up to three different reservoir property values out of the various reservoir property values. The memory includes functionality for generating a two-dimensional (2D) pixel dataset using the 3D pixel dataset. The 2D pixel dataset corresponds to a single video frame within a plurality of video frames. The memory includes functionality for generating a compressed video dataset using the plurality of video frames and a video compression algorithm.

In general, in one aspect, embodiments disclosed herein relate to a non-transitory computer readable medium storing instructions executable by a computer processor. The instructions include functionality for generating three-dimensional (3D) reservoir simulation data regarding a subsurface formation. The 3D reservoir simulation data corresponds to a plurality of reservoir properties at a predetermined timestep within a reservoir simulation. The instructions include functionality for generating a 3D pixel dataset using the 3D reservoir simulation data. Each pixel of the 3D pixel dataset is determined based on a plurality of reservoir property values. Each pixel of the 3D pixel dataset includes a red value, a green value, and a blue value to represent up to three different reservoir property values out of the various reservoir property values. The instructions include functionality for generating a two-dimensional (2D) pixel dataset using the 3D pixel dataset, wherein the 2D pixel dataset corresponds to a single video frame within a plurality of video frames. The instructions include functionality for generating a compressed video dataset using the plurality of video frames and a video compression algorithm.

Other aspects of the disclosure will be apparent from the following description and the appended claims.

BRIEF DESCRIPTION OF DRAWINGS

The patent or application file contains at least one drawing executed in color. Copies of this patent or patent application publication with color drawing(s) will be provided by the Office upon request and payment of the necessary fee.

Specific embodiments of the disclosed technology will now be described in detail with reference to the accompanying figures. Like elements in the various figures are denoted by like reference numerals for consistency.

DETAILED DESCRIPTION

Figure 1:
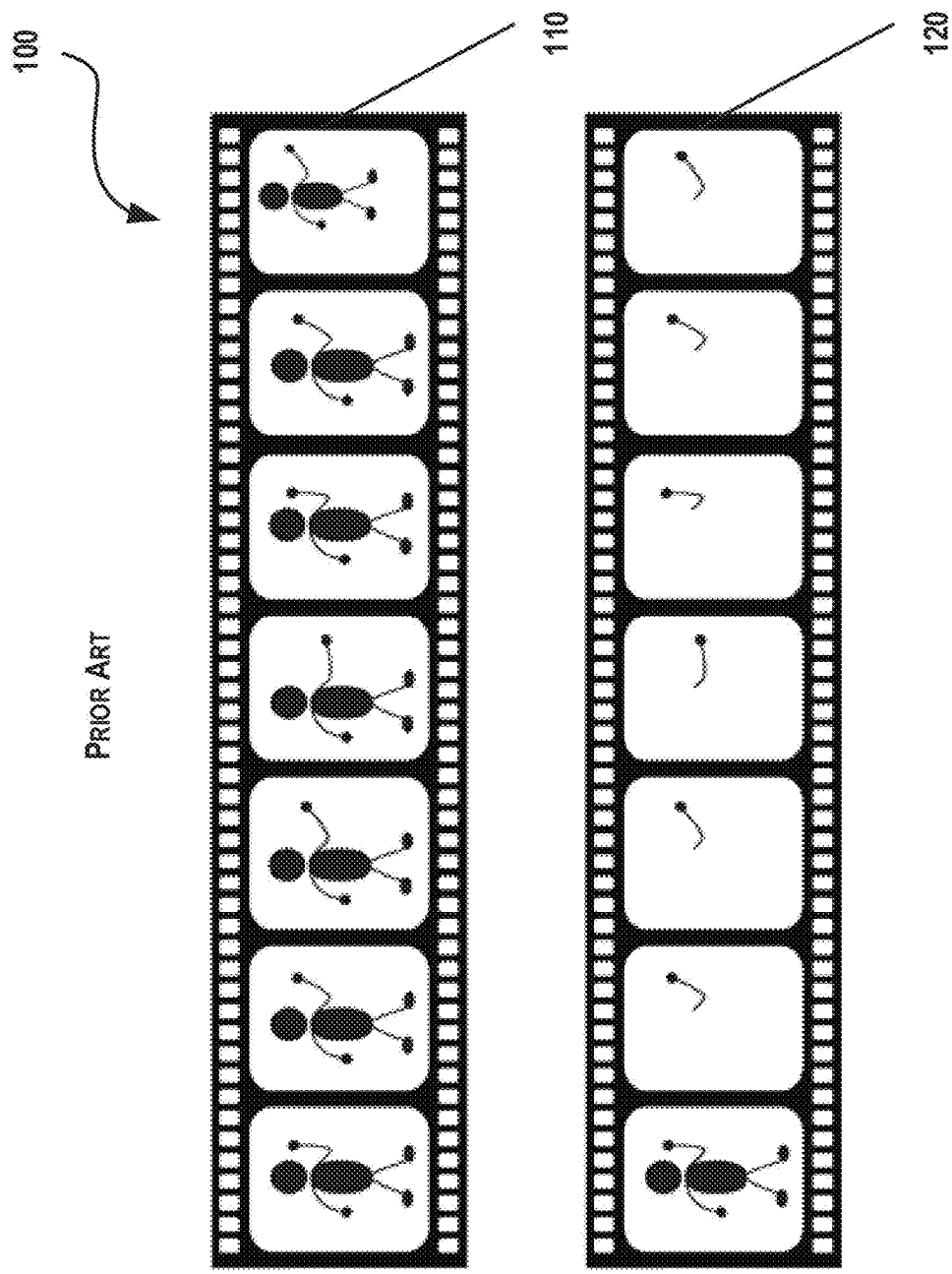
FIG. 1 shows different types of video frame compression techniques.

Specific embodiments of the disclosure will now be described in detail with reference to the accompanying figures Like elements in the various figures are denoted by like reference numerals for consistency.

In the following detailed description of embodiments of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as using the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In parallel reservoir simulation, massively sized files are typically written recurrently throughout a simulation run. The files are the simulator's internal files that are a binary representation of multiple properties representing the reservoir state at a chosen time. These files can be used by end users to analyze the reservoir properties over time or to resume the simulation from an arbitrary point in time (restart files). The resulting output files can grow to massive sizes which can reach hundreds of terabytes. Apart from increasing the spatial resolution of simulation models, the frequency of the output can also increase as the input data and controls become more refined which is equivalent to increasing the temporal resolution. Engineering studies such as history matching and evaluating different scenarios require running the models typically hundreds of times further amplifying already high storage requirements. Reducing the size of the outputted files leads to savings on storage requirements.

In one or more embodiments, video compression algorithms are used in video storage to reduce massive amounts of data that are required to keep track of colors for every pixel. The basic principle allowing for very high and nearly lossless compression is called interframe compression, in which rather than storing color information for every pixel of the frame, only differences in relation to a keyframe are stored. This type of compression is applicable as video frame background does not change as often as foreground elements, and even if changes happen, they tend to happen gradually over time. Another, more sophisticated algorithm is forward picture prediction which aims to find the movement of elements in the picture in relation to previous frames. Both algorithms are implemented for describing a video frame by using neighboring frames rather than treating each frame independently.

In one or more embodiments, storage capacity taken up by storing the output data of reservoir simulation is reduced by employing video compression algorithms to dynamic data evolving over time. According to some embodiments, using video compression algorithms has advantages such as the ability to append the data and the ability to preview the data without decompressing it. Reservoir simulation high-fidelity models are typically large (i.e., millions to hundreds of millions of cells), making the dynamic output of a reservoir simulation challenging to store as its size is measured in hundreds of giga- or tera-bytes. To this point, one or more embodiments disclosed herein describe a way to store the output of reservoir simulation data as a fraction of its original size, while enabling reservoir personnel to store the results of more simulation runs, reducing storage costs, and observing any simulation data without requiring data decompression. That is, in some embodiments, the invention increases reservoir productivity as the data does not need to be decompressed before observing it. In particular, reservoir productivity may increase as a result of allowing reservoir engineers to evaluate more simulation scenarios in shorter amount of time.

Further, in one or more embodiments, compression may be applied during the simulation rather than after the simulation is finished. Advantageously, the invention increases reservoir productivity as compression after the raw data has been written will always result in introducing overhead in terms of the runtime.

In one or more embodiments, reservoir simulation dynamic output data is compressed using video compression algorithms. The video compression algorithms convert three-dimensional (3D) space information of the reservoir into two-dimensional (2D) space information using imaging techniques based on individual pixel compression and forward picture prediction schemes. Using video compression algorithms allows the system to compress the data at a very high compression ratio while keeping errors to a minimum. Further, as mentioned above, the data can be previewed and/or analyzed without the need for decompression of the data, as the data is stored as a video file.

FIG. 1 illustrates two different types of compression schemes 100. Specifically, FIG. 1 shows an example of an intraframe compression scheme 110 and an example of an interframe compression scheme 120. Intraframe means that all the compression is done within that single frame, which requires every frame to be encoded individually. Interframe refers to compression that takes place across two or more frames, where the encoding scheme only keeps the information that changes between frames and only requires the differences between frames to be encoded for each group of frames. These compression schemes 100 may be implemented in the oil and gas industry as described in FIGS. 3-19B through video compression algorithms selected based on the needs and requirements of a project.

Intraframe codecs have a higher data rate than interframe codecs, but require less computing power to decode. This becomes important in editing, where any cuts or changes cause interframe codecs to lose information from adjacent frames. Further, interframe compression may prevent video storage shortages by reducing massive amounts of data as the corresponding video compression algorithm may require to only keep track of colors for every pixel. Rather than storing color information for every pixel of the frame, only differences in relation to the frame are stored.

Figure 2:
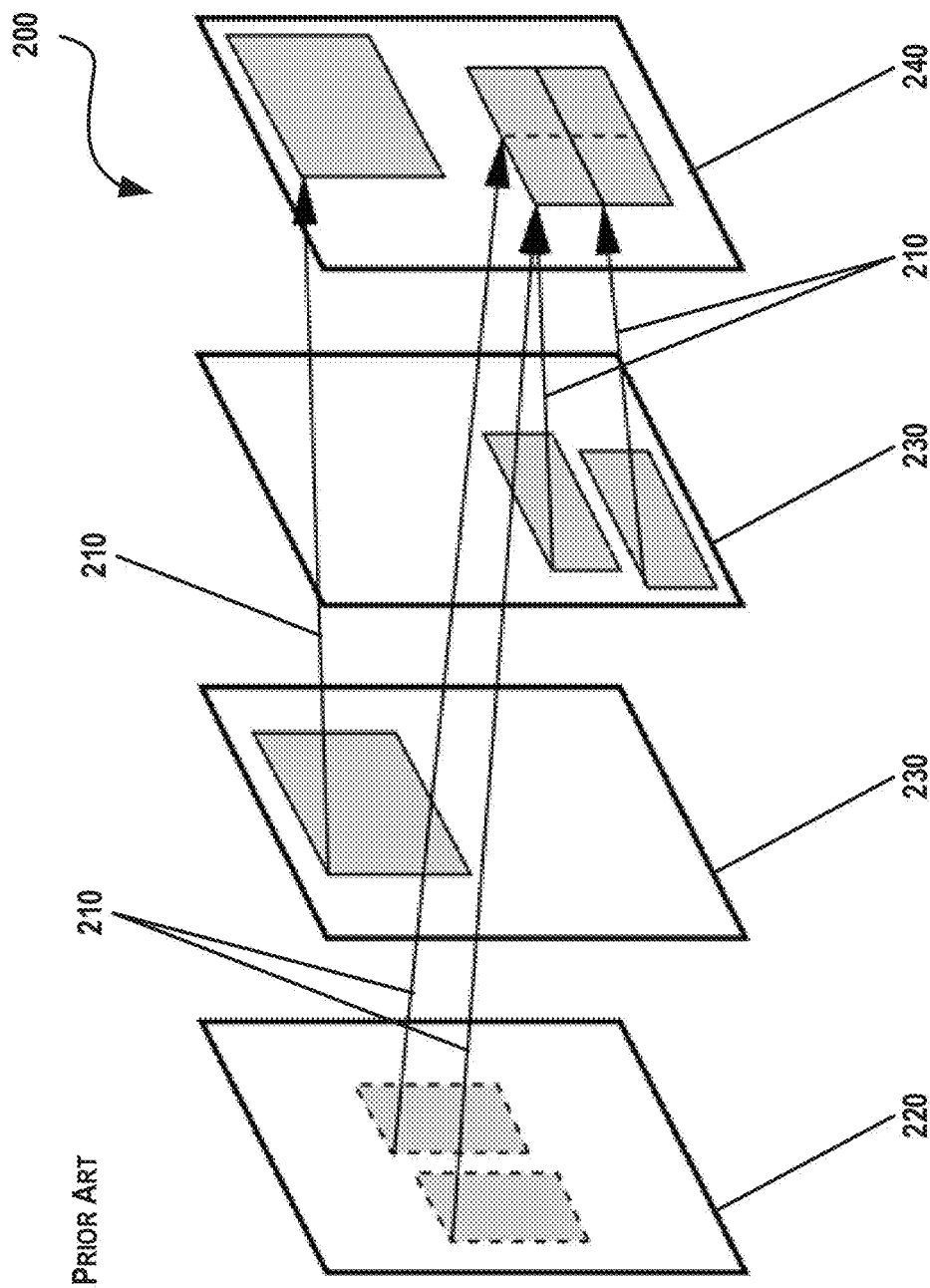
FIG. 2 shows a type of video frame compression technique.

FIG. 2 illustrates a forward only picture prediction scheme with motion compensation. Specifically, FIG. 2 shows a representation of a motion compensation prediction algorithm 200, in which only the movement of elements in the picture in relation to previous frames is tracked. Motion-compensated prediction (MCP) decreases a number of necessary bits needed for quantization of a frame 220 by encoding an error 210 of a predicted motion in a current frame 240. A reconstructed copy of the previous frame is kept at both the encoder and decoder. The intermediate frame 230 is broken up into blocks, usually of 8×8 or 16×16 pixels. The previous reconstructed frame 220 is also broken into blocks. Each of the reconstructed frame's blocks is shifted to a maximum displacement in the forward direction. Each of these blocks in the reconstructed current frame 240 is compared to the block in the intermediate frame 230, and the sum-of-squared differences (SSD), or the sum of absolute differences (SAD) is computed. The error block is saved in an error image the same size as the current frame. The number of pixel shifts in both directions (dx,dy) is also saved for each block. The error blocks are quantized and sent along with the displacement vectors for each block, which are usually differentially and Huffman coded.

Figure 3:
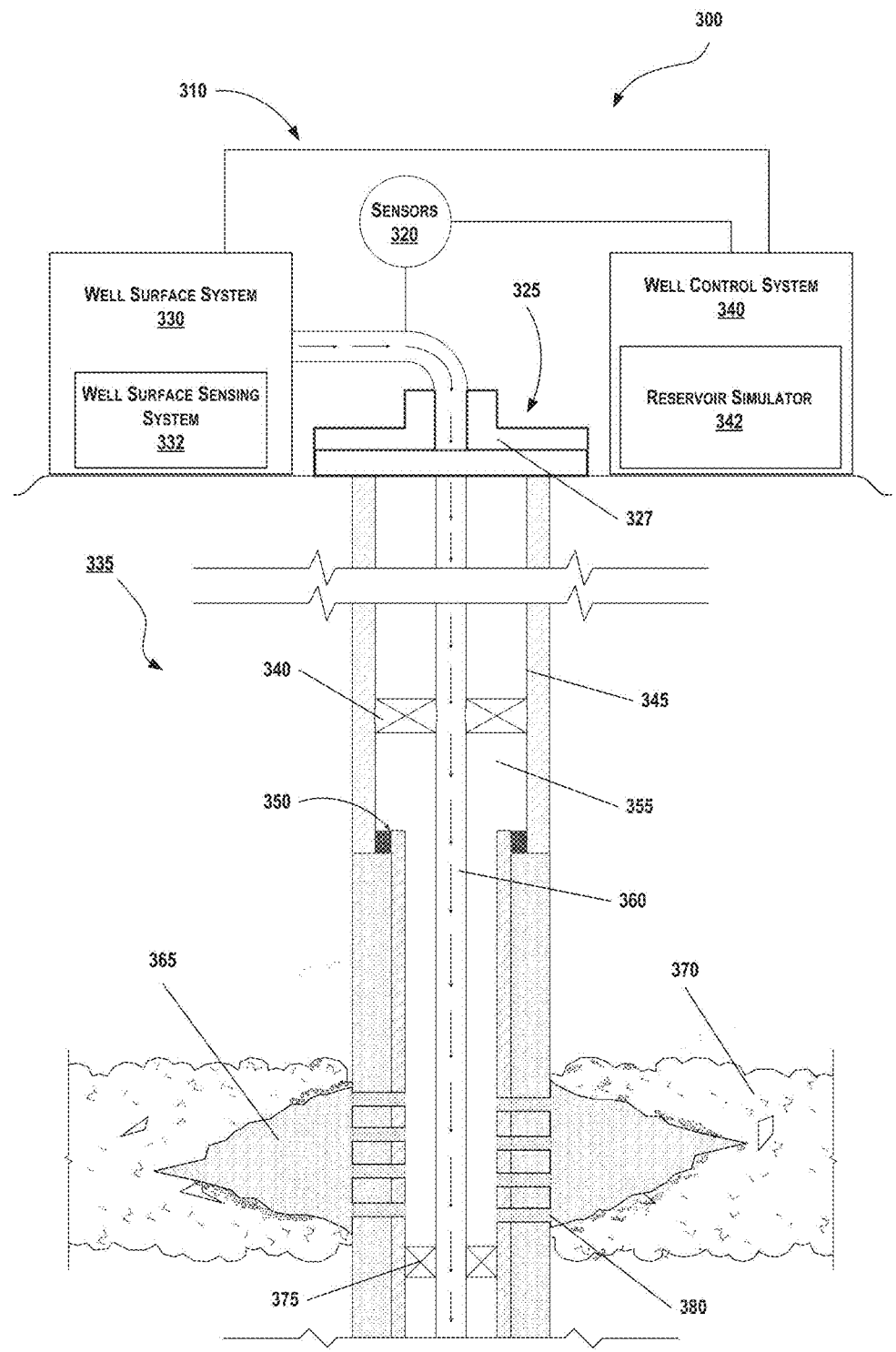
FIG. 3 shows a well system in accordance with one or more embodiments.

FIG. 3 shows a schematic diagram illustrating a well environment 300 that includes a reservoir located in a subsurface formation ("formation") 370 and a well system 310. The formation 370 may include a porous or fractured rock formation 365 that resides underground, beneath Earth's surface ("surface"), and in connection to the wellbore 345 through one or more perforations 380. In the case of the well system 110 being a hydrocarbon well, the reservoir may include a portion of the formation 370 that includes a subsurface pool of hydrocarbons, such as oil and gas. The formation 370 and a reservoir may include different layers of rock having varying characteristics, such as varying degrees of permeability, porosity, and resistivity. In the case of the well system 310 being operated as a production well, the well system 310 may facilitate the extraction of hydrocarbons (or "production") from the reservoir.

In some embodiments, the well system 310 includes a wellbore 345, a well sub-surface system 335, a well surface system 330, and a well control system ("control system") 340. The control system 340 may control various operations of the well system 3100, such as well production operations, well completion operations, well maintenance operations, and reservoir monitoring, assessment and development operations. In some embodiments, the control system 340 includes a computer system that is the same as or similar to that of computer system 1900 described below in FIGS. 19A and 19B and the accompanying description.

The wellbore 345 may include a bored hole that extends from the surface into a target zone of the formation 370, such as the reservoir. An upper end of the wellbore 345, terminating at or near the surface, may be referred to as the "up-hole" end of the wellbore 345, and a lower end of the wellbore, terminating in the formation 370, may be referred to as the "down-hole" end of the wellbore 345. The wellbore 345 may facilitate the circulation of drilling fluids during drilling operations, the flow of hydrocarbon production ("production") (e.g., oil and gas) from the reservoir to the surface during production operations, the injection of substances (e.g., water) into the formation 370 or the during injection operations, or the communication of monitoring devices (e.g., logging tools) into the formation 370 or the reservoir during monitoring operations (e.g., during in situ logging operations).

In some embodiments, during operation of the well system 310, the control system 340 collects and records wellhead data for the well system ("well") 310. The wellhead data may include, for example, a record of measurements of wellhead pressure (Pwh) (e.g., including flowing wellhead pressure), wellhead temperature (Twh) (e.g., including flowing wellhead temperature), wellhead production rate (Qwh) over some or all of the life of the well system 310, and water cut data. In some embodiments, the measurements are recorded in real-time, and are available for review or use within seconds, minutes or hours of the condition being sensed (e.g., the measurements are available within 1 hour of the condition being sensed). In such an embodiment, the wellhead data may be referred to as "real-time" wellhead data. Real-time wellhead data may enable an operator of the well system 310 to assess a relatively current state of the well system 310, and make real-time decisions regarding development of the well system 310 and the reservoir, such as on-demand adjustments in regulation of production flow from the well.

In some embodiments, the well sub-surface system 335 includes casing installed in the wellbore 345. For example, the wellbore 345 may have a cased portion and an uncased (or "open-hole") portion. The cased portion may include a portion of the wellbore having casing (e.g., casing pipe and casing cement) disposed therein. The uncased portion may include a portion of the wellbore not having casing disposed therein. In some embodiments, the casing includes an annular casing 350 that lines the wall of the wellbore 345 to define an annulus 355 and a central passage 360 that provides a conduit for the transport of tools and substances through the wellbore 345 and upper and/or lower packers 375. For example, the central passage may provide a conduit for lowering logging tools into the wellbore 345, a conduit for the flow of production (e.g., oil and gas) from the reservoir to the surface, or a conduit for the flow of injection substances (e.g., water) from the surface into the formation 370. The well sub-surface system 335 includes production tubing installed in the wellbore 345. The production tubing may provide a conduit for the transport of tools and substances through the wellbore 345. The production tubing may, for example, be disposed inside casing. In such an embodiment, the production tubing may provide a conduit for some or all of the production (e.g., oil and gas) passing through the wellbore 345 and the casing.

In some embodiments, the well surface system 330 includes a wellhead 325. The wellhead may include structures 327 for supporting (or "hanging") casing and production tubing extending into the wellbore 345. Production may flow through the wellhead, after exiting the wellbore 345 and the well sub-surface system 335, including, for example, the casing and the production tubing. In some embodiments, the well surface system 330 includes flow regulating devices that are operable to control the flow of substances into and out of the wellbore 345. For example, the well surface system 330 may include one or more production valves that are operable to control the flow of production. For example, a production valve may be fully opened to enable unrestricted flow of production from the wellbore 345.

The well surface system 330 includes a well surface sensing system 332. The well surface sensing system 332 may be coupled to sensors 320 for sensing characteristics of substances, including production, passing through or otherwise located in the well surface system 330. The characteristics may include, for example, pressure, temperature and flow rate of production flowing through the wellhead 325, or other conduits of the well surface system 330, after exiting the wellbore 345.

The sensors 320 include a surface pressure sensor operable to sense the pressure of production flowing to the well surface system 330, after it exits the wellbore 345. The surface temperature sensor may include, for example, a wellhead temperature sensor that senses a temperature of production flowing through or otherwise located in the wellhead, referred to as "wellhead temperature" (Twh). In some embodiments, the sensors 320 include a flow rate sensor operable to sense the flow rate of production flowing through the well surface system 330, after it exits the wellbore 345. The flow rate sensor may include hardware that senses a flow rate of production (Qwh) passing through the wellhead.

The well control system 340 includes a reservoir simulator 342. For example, the reservoir simulator 342 may include hardware and/or software with functionality for generating one or more reservoir models regarding the formation 370 and/or performing one or more reservoir simulations. For example, the reservoir simulator 342 may perform video compression and frame coding and encoding. Further, the reservoir simulator 342 may store well logs and data regarding core samples for performing simulations. While the reservoir simulator 342 is shown at a well site, embodiments are contemplated where reservoir simulators are located away from well sites. In some embodiments, the reservoir simulator 342 may include a computer system that is similar to the computer system 1900 described below with regard to FIGS. 19A and 19B and the accompanying description.

In one or more embodiments, the reservoir simulator 342 may process and store reservoir information following one or more compressions techniques described above. Further, the reservoir simulator 342 may process reservoir simulation data to generate compressed video datasets using a video compression algorithm. The video compression algorithm may incorporate obtaining information relating to the reservoir and storing this information by convert three-dimensional reservoir simulation data into two dimensional pixel datasets. Once the pixel dataset is generated, the reservoir simulator 342 may generate a compressed video for observing the reservoir simulation in a compressed form. As such, the reservoir simulator 342 may comprise computational capabilities for processing and indexing compression ratios, dimensions, pixels, and floating point values. For example, the reservoir simulator 342 may determine a ratio between the uncompressed and compressed size of a file.

While FIG. 3 shows various configurations of components, other configurations may be used without departing from the scope of the disclosure. For example, various components in FIG. 3 may be combined to create a single component. As another example, the functionality performed by a single component may be performed by two or more components.

Figure 4:
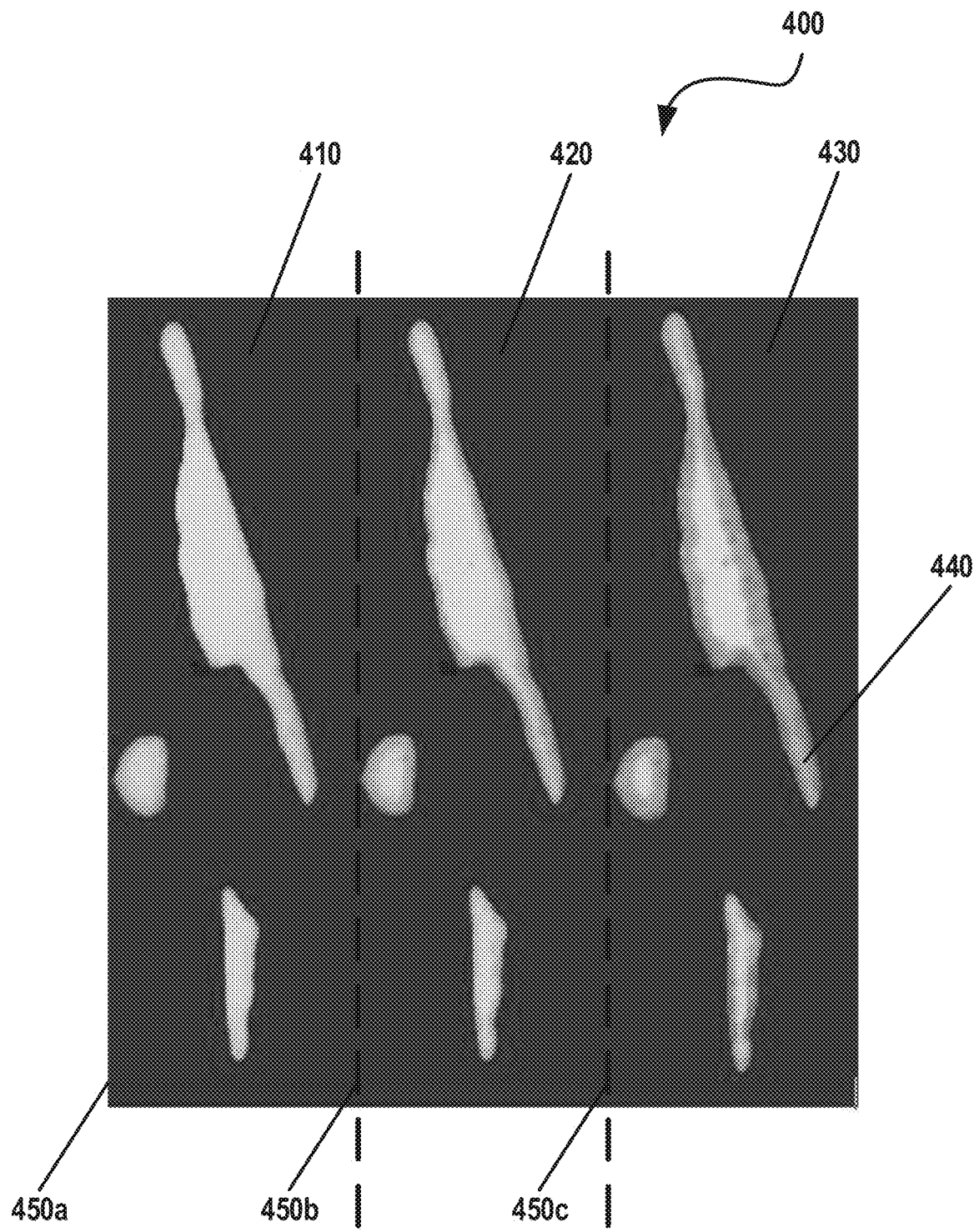
FIG. 4 shows an example of a simulation output in accordance with one or more embodiments.

FIG. 4 illustrates a simulation result 400 that shows oil saturation a predetermined timesteps during a simulation performed by a reservoir simulator (i.e., the reservoir simulator 342). The simulation result 400 shows the same layer at three different times during the simulation in which gradual changes may be seen as the simulation progresses The predetermined timestep indicates a time duration for a layer or a set of layers. In the simulation result 400, three timesteps show smooth transitions between the layer in which high compression rates highlight different depths inside the reservoir progressively over time. The layer includes starting points 450a-450c based on a time duration for each individual video frame. The first timestep 410 shows a representation of the reservoir in which light colors are the majority of the colors shown. The second timestep 420 and the third timestep 430 gradually change the representation of the reservoir to include darker tones 440 as simulation time progresses. In one or more embodiments, video compression is utilized for reducing a size of data output in the reservoir simulation. The different layers correspond to different layers of a same depth such that the first timestep 410 is above the second timestep 420, and the second timestep 420 is above the third timestep 430. To this point, the reservoir simulator 342 converts properties found in reservoir files from a 3D space to a 2D space (for example, a video frame analog), converts floating point continuous properties to Red-Green-Blue color model, and creates a "video" comprised of number of frames equal to a number of times an output routine is implemented, with each frame composed of model dimensions (NX*NY*NZ) pixels. The size of a reservoir simulation model data is usually described using (X,Y,Z) dimensions or (I,J,K) dimensions. In this convention, NX describes the number of cells in X direction. A number of cells in the vertical dimension (Z or K) is also referred to as the number of model layers (or NZ, NK). A floating point value is one of the number representations used to describe rational numbers. In this case, the IEEE 754-1985 standard and its specification of "double" as a number occupying 64 bits (i.e., sign+11 bit exponent+52 bit fraction) may be used with 15 decimal digits of precision.

Figure 5:
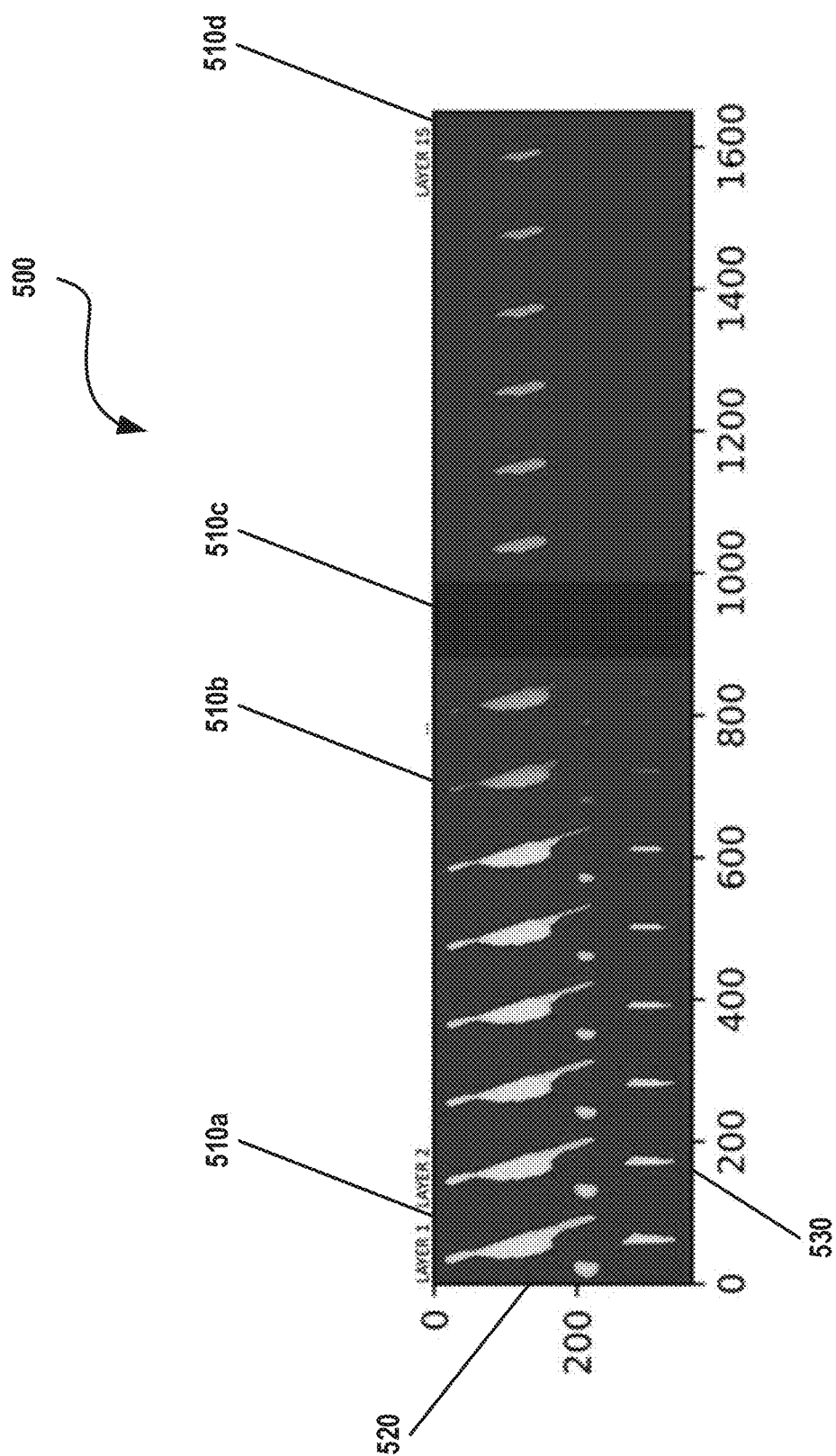
FIG. 5 shows an example of a simulation output in accordance with one or more embodiments.

FIG. 5 illustrates a simulation result 500 that shows a 2D representation of a 3D oil saturation at a predetermined timestep. Specifically, FIG. 5 shows that the timestep includes an overall time duration for multiple layers 510a-510d. Each layer is a compressed video frame including progressively different levels of shading (i.e., timestep 510a at layer 1 shows a reservoir similar to that one shown at the first layer 410 in FIG. 4) based on depth changes in a reservoir. The timestep in the simulation result shown in FIG. 5 expands to fifteen (15) layers, which include additional information regarding the depth of the reservoir. The layers may be obtained by processing pixels 520 over a period of time 530 using a same predetermined timestep. For example, video compression algorithms may be used to generate 2D frames from the 3D reservoir simulation models. Mapping of the reservoir in 2D may include layers having their own separated compressed video, and the video may be stitched together at the end of the simulation.

Further, FIG. 5 represents 15 layers of oil saturation of a model mapped to 2D. The video compression algorithm may decide if the created image should generate a new video (for example, at the first output step) or should be attached to an existing video. Alternatively, the video compression algorithm may decide to buffer a given number of video frames if the compression algorithm requires it (for example, if the compression algorithm uses future information in the current frame). In a case where no previous frames for the given property exist, a new video with one video frame may be started and this video may be created and all metadata may be initialized (such as, video size, frames per second, file name, and other parameters). If a video of the property already exists, then the video compression algorithm may encode/compress the current frame and append it to the video.

Figure 6:
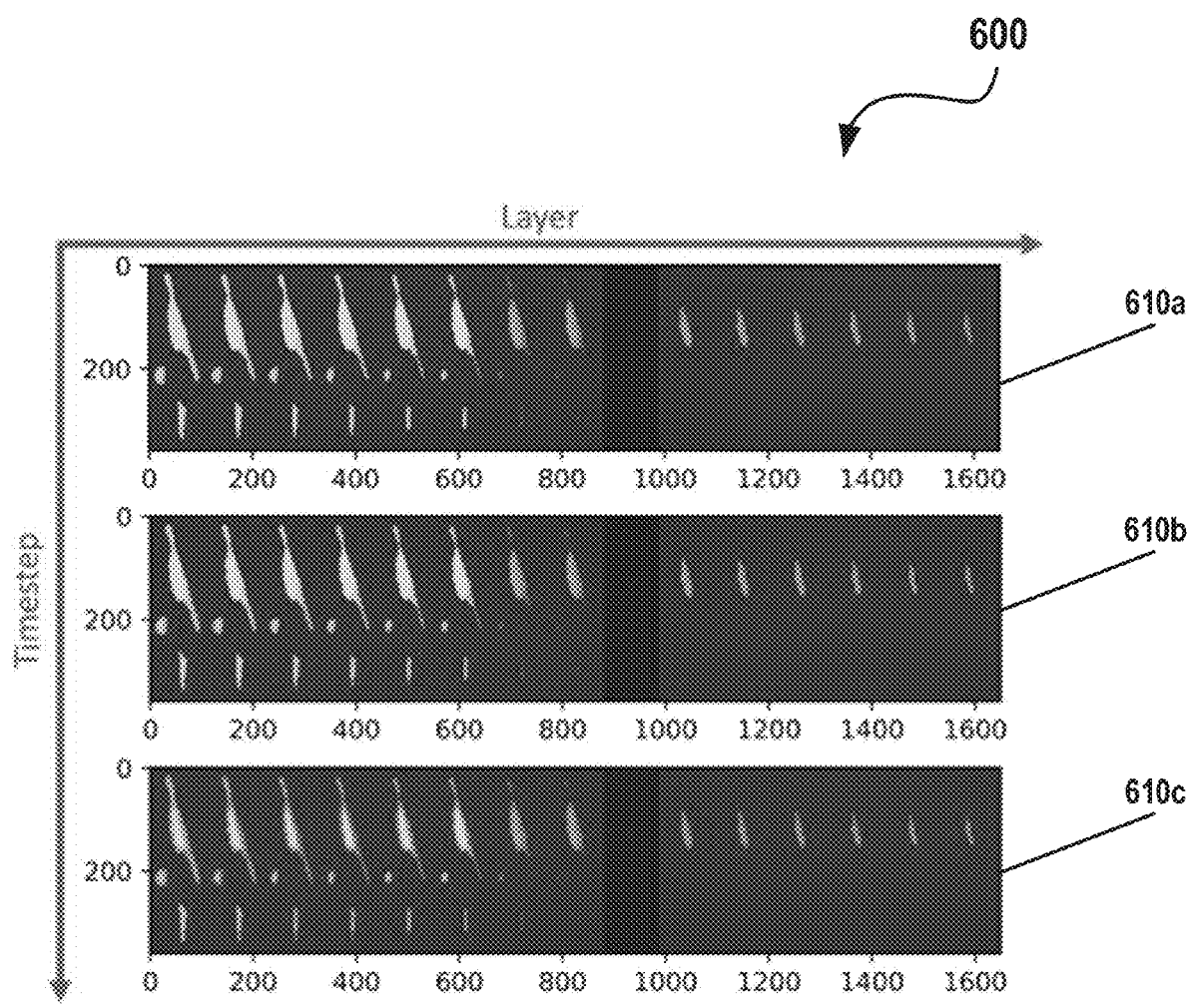
FIG. 6 shows examples of simulation outputs in accordance with one or more embodiments.

FIG. 6 illustrates simulation results 600 that show a 2D representation of a 3D oil saturation on three timesteps 610a-610c. The timesteps include a changing number of pixels between the reservoir simulator's output at two consecutive timesteps. The simulation results 600 show oil saturation properties of a reservoir. In these cases, oil saturation exhibits more gradual changes. To this point, a cell with exactly the same value between timesteps retains its exact color between two consecutive timesteps. If all the cells are of the same color, the frames may be identical.

As shown in FIG. 6, reservoir simulation data is not only similar in time but also between layers (i.e., output of a property at time N will be similar to that of time N+1 but also layer X at time N will be similar to layer X+1 at time N). This is a result of the reservoir simulation model being a discretization of continuous properties and as the models are more refined, the layers become, in general, more similar to their neighbors. This characteristic is used for compressing "multidimensionally" using a video frame of size X*Y with two layer-first or timestep-first ordering:

$Property_{timestep\ 1}^{layer\ 1}$, $Property_{timestep\ 1}^{layer\ 2}$, ..., $Property_{timestep\ 1}^{layer\ Z}$, $Property_{timestep\ 1}^{layer\ 2}$, ...

$Property_{timestep\ 1}^{layer\ 1}$, $Property_{timestep\ 2}^{layer\ 1}$, ..., $Property_{timestep\ N}^{layer\ 1}$, $Property_{timestep\ 1}^{layer\ 2}$, ...

A combination of described methods can be used as well where each video frame would describe a subset or a superset of different layers.

Figure 7:
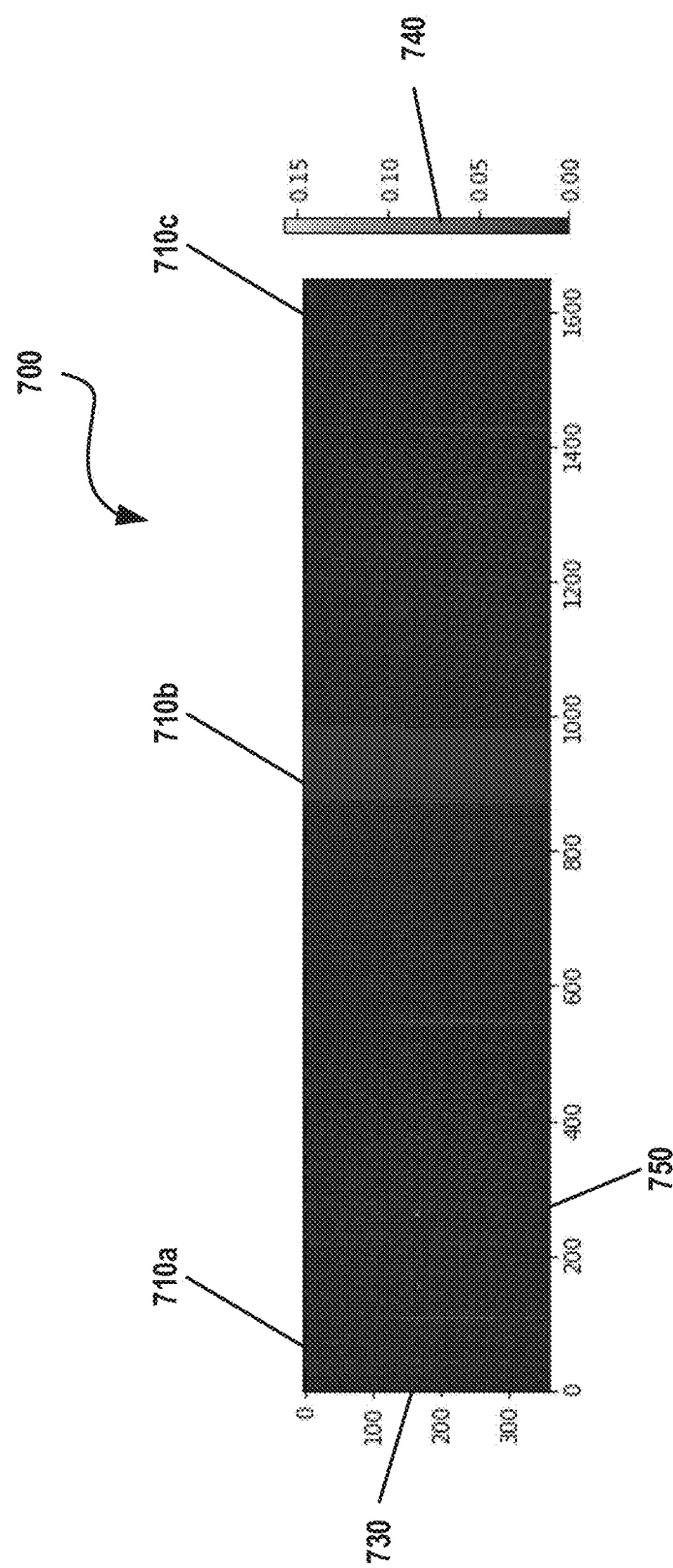
FIG. 7 shows relative timestep error in an example of a simulation output in accordance with one or more embodiments.
Figure 8:
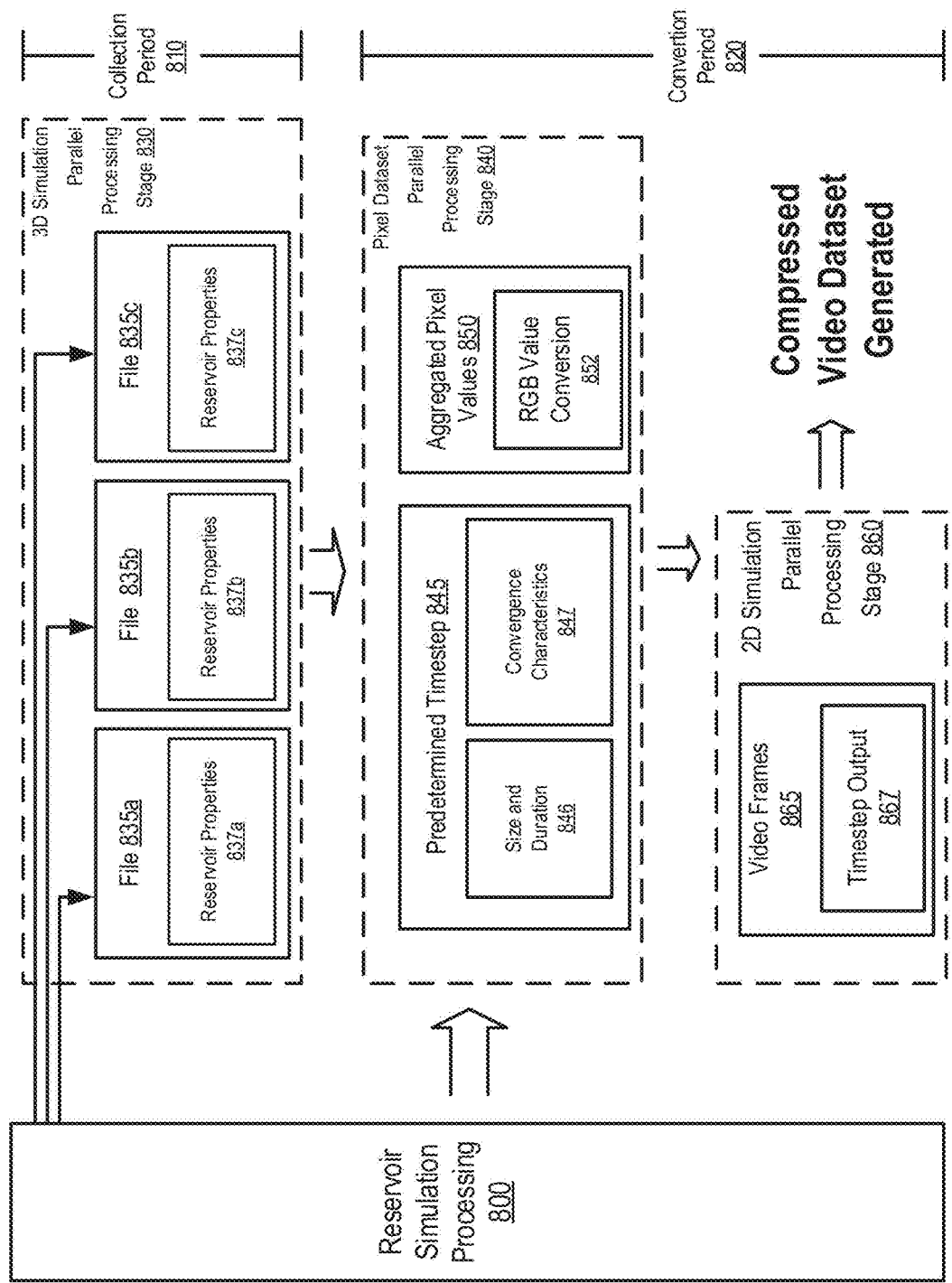
FIG. 8 shows a processing example in accordance with one or more embodiments.

FIG. 7 illustrates a simulation result 700 that shows a relative error for one timestep of a pressure field. In particular, simulation result 700 shows an error 730 over layers 710a-710c over a timestep 750. This "error" may be a difference between a compressed version of FIG. 5 and its corresponding uncompressed version. The gradient 740 shows a color scheme using correlating errors marked (i.e., the dots in the layers). The colors scheme ranges from black 0.00 (i.e., 0%) to white 0.15 (i.e., 15%). As shown in FIG. 7, most of the error is at the boundary between layers (i.e., white vertical lines). Further, FIG. 7 shows that when compressing the pressure field one of the principal source of error is the boundaries between different layers. Since the value of the pressure in different layers is different (mainly due to gravity effects), those boundaries represent a sharp change of pressure that are not handled efficiently by the encoders. To this point, a solution according to one or more embodiments is to save all layers separately FIG. 8 shows an example of generating a compressed video dataset. Specifically, a process of compressing 3D information and converting the 3D space information into the 2D space information may be divided into various parallel processing stages (i.e., 3D simulation parallel processing stage 830, pixel datasheet parallel processing stage 840, and 2D simulation parallel processing stage 860). In particular, a parallel processing stage may include multiple simulation processes that are performed simultaneously using different processing techniques. For example, in the 3D simulation parallel processing stage 830, reservoir simulation data may be obtained through reservoir simulation processing 800 from various files simultaneously as a compressing request repeated in a given time period. The reservoir simulation processing 800 may use processing means for scanning and searching each file for any reservoir simulation data. For example, reservoir simulation data relating to file 835a, file 835b, and file 835c may be scanned by a reservoir simulator 342. In this case, the reservoir simulator 342 may fetch any files accessible through wired and wireless connections based on one or more search parameters. The reservoir simulator 342 may extrapolate reservoir properties (for example, reservoir properties 837a, reservoir properties 837b, and reservoir properties 837c) from each file (835a, 835b, 835c, respectively) obtained. Thus, any number of properties may be represented.

As shown in FIG. 8, after completing the 3D simulation parallel processing stage 830, the process of compressing the reservoir simulation data proceeds to the pixel datasheet parallel processing stage 840, and finally to the 2D simulation parallel processing stage 860 to complete the process of generating the compressed video dataset.

With regard to the pixel datasheet parallel processing stage 840, the reservoir simulator 342 may determine or identify predetermined timesteps 845 for identifying information relating to the various subsurface layers with respect to size and duration 846 and convergence characteristics 847. Specifically, convergence characteristics 847 may be linear and non-linear parameter requirements based on a total period duration of each reservoir simulation and the size of the reservoir simulation in pixels. Further, the information relating to the various reservoir properties may include aggregated pixel values 850 based on parameters relating to Red-Green-Blue (RGB) weighted values and their respective RGB value conversion 852. Pixels are the smallest unit of a digital image. An image of dimensions X*Y consists of X*Y pixels each of which is described by RGB values. RGB values are three integers describing the intensity of Red, Green and Blue colors respectively. RGB model uses the integer range from 0 to 255 to describe the intensity of colors.

According to one or more embodiments, various reservoir simulation properties are represented using different scales. Some of the outputted properties may be oil saturation, water saturation, and gas saturation. These properties may be represented using floating point numbers in the range between 0 and 1. Since video compression algorithms work on pixels representing colors, a mapping from floating numbers to RGB values enables using the video compression algorithms in reservoir simulation. Specifically, because each pixel is described by three integer values of range 0-255 representing three base colors—Red, Green and Blue, two mappings between property values and color may be implemented. For example, a first mapping may entail converting 3 values (i.e., Oil, Water, and Gas) to corresponding RGB channels. This mapping may allow representing 3 properties on a single image without sacrificing accuracy. Specifically, as each property is represented using an integer in range 0-255 (i.e., 8-bit), a maximum resolution may be 1/256, which is equivalent to 0.4%.

In some embodiments, all the channels of an RGB tuple (i.e., a tuple being an ordered set of values) may be used for representing a single output property. In this case, to preserve low storage footprint upon compression, only a few intermediate colors may be defined to correspond to intermediate floating point values. These intermediate floating point values may be in between the defined values and may be converted by interpolation. For example a floating point value for oil between 0.0 and 1.0 and its corresponding RGB value may be further defined by:

Oil=0.0→RGB=(0,0,0)

Oil=0.25→RGB=(0,0,100)

Oil=0.5→RGB=(0,170,170)

Oil=0.75→RGB=(170,170,0)

Oil=1.0→RGB=(255,255,255)

Each floating-point value may be found through interpolation. Once the values are represented as RGB colors, the next conversion process may be executed by mapping a 3D modeling to an equivalent 2D video frame. In this case, to further preserve the highest compression rates, the reservoir simulator 342 running 3D models may determine to copy and skip models that are in a 2D space already.

Further, with regard to the 2D simulation parallel processing stage 860, the reservoir simulator 342 may create one or more video frames 865 for a given timestep output 867. As such, a compressed video dataset may be generated such that the 3D reservoir simulation data obtained by the reservoir simulation processing 800 is reduced into 2D output of reservoir simulation data in a video format.

In some embodiments, a reservoir simulation is divided into one or more obtaining periods (i.e., collection period 810) and/or one or more releasing periods (i.e., conversion period 820). In the obtaining periods, data is collected by the various processing means from each file and this data is relayed by their associated reservoir simulator. In the releasing periods, processed data may be processed into one or more video frames such that the reservoir simulator can generate compressed video dataset.

For example, a real field model consisting of 594,000 grid blocks (360×110×15) may include pressure and oil saturation fields exported with a 3-day frequency, uncompressed, and video compressed output were exported with the same frequency. Constant bitrate and H.264 video format may be used for the video compression. At this point, a sensitivity analysis of the error to different bitrates/compression levels for both pressure and saturation may be easily implemented.

Table 1 and Table 2 summarize the results for saturation and pressure respectively. The results show the achieved compression ratio, which is calculated based on the size of the resulting video file and the original size of the binary files. Three different measurements of error are shown: the maximum relative error over all timesteps, the average error of the maximum timestep error and the root mean square error for all the cells at all timesteps.

TABLE 1

| Bit Rate (Mbps) | mean (max($e_{ts}$)) | max (max($e_{ts}$)) | RMSE | Video Size | Compression Ratio |
|---|---|---|---|---|---|
| 0.19 | 0.4162 | 0.5455 | 0.0003 | 19.5 | 1115 |
| 0.5 | 0.1119 | 0.4805 | 0.0002 | 31.4 | 693 |
| 1 | 0.1092 | 0.4675 | 0.0002 | 43.7 | 498 |
| 1.5 | 0.1091 | 0.4805 | 0.0002 | 43.96 | 495 |
| 2 | 0.1090 | 0.1429 | 0.0002 | 44.07 | 494 |
| 3 | 0.1088 | 0.1299 | 0.0002 | 44.1 | 493 |
| 7 | 0.1088 | 0.1193 | 0.0002 | 44.1 | 493 |
| 10 | 0.1088 | 0.1193 | 0.0002 | 44.1 | 493 |
| 12 | 0.1088 | 0.1193 | 0.0002 | 44.1 | 493 |

TABLE 2

| Bit Rate (Mbps) | mean (max($e_{ts}$)) | max (max($e_{ts}$)) | RMSE | Video Size | Compression Ratio |
|---|---|---|---|---|---|
| 0.5 | 0.164952 | 0.428571 | 2.92E-05 | 31.4 | 692.6752 |
| 1 | 0.155409 | 0.402597 | 2.53E-05 | 50.51 | 430.6078 |
| 3 | 0.151277 | 0.181416 | 2.39E-05 | 106.5 | 204.2254 |
| 7 | 0.154837 | 0.185841 | 2.49E-05 | 132.5 | 164.1509 |
| 10 | 0.155509 | 0.185841 | 2.52E-05 | 130 | 167.3077 |
| 12 | 0.1542 | 0.188 | 2.55E-05 | 133 | 163.5338 |
| 0.5 | 0.164952 | 0.428571 | 2.92E-05 | 31.4 | 692.6752 |

Figure 9:
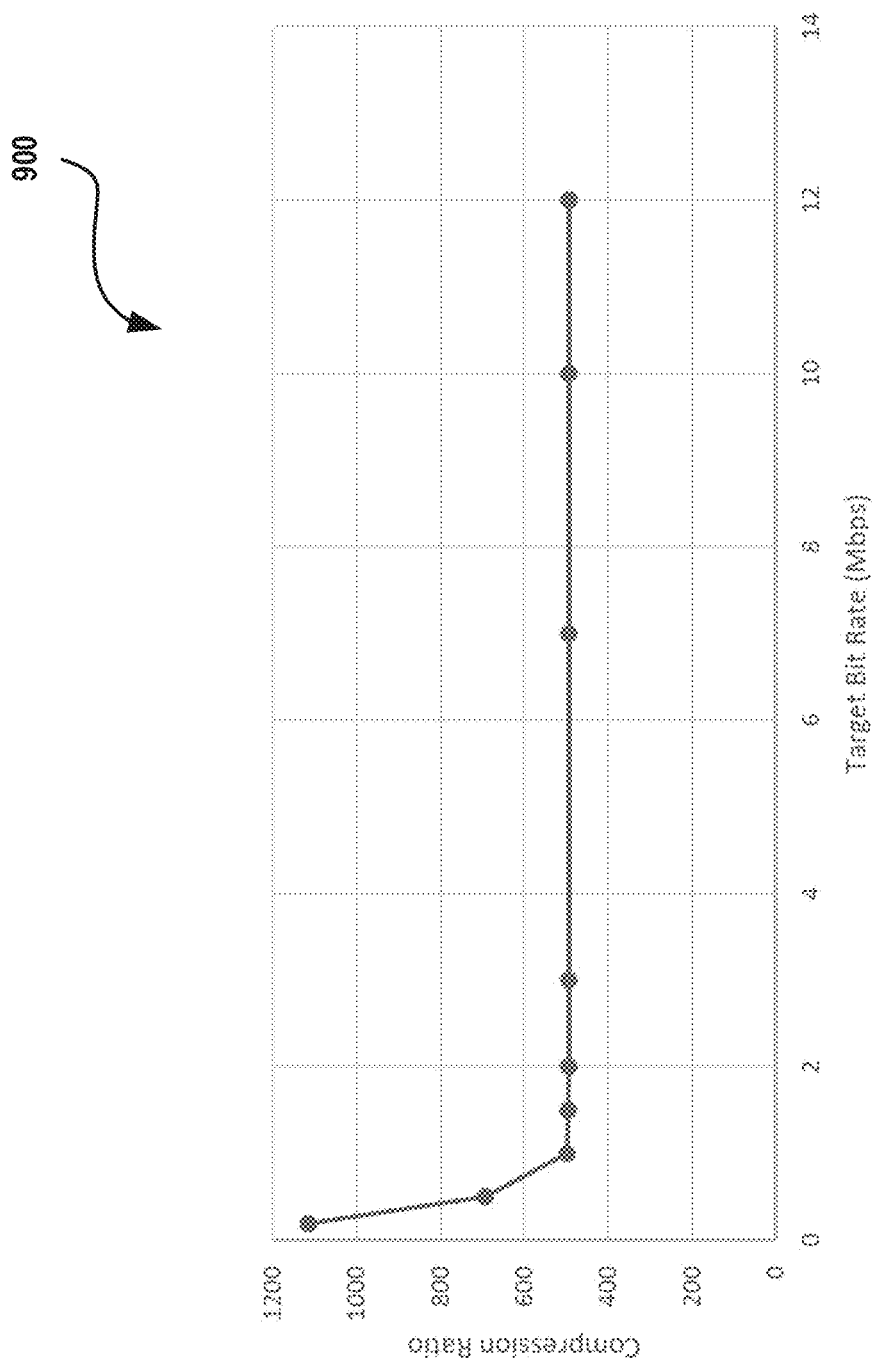
FIG. 9 shows a graph in accordance with one or more embodiments.

FIG. 9 shows a graph illustrating compression ratios versus target bit rates achieved. It can be seen that the minimum compression ratio is achieved at around 1-1.5 Mbps and if the bit rate increases beyond that threshold no further increase in the final video file size is observed.

Figure 10A:
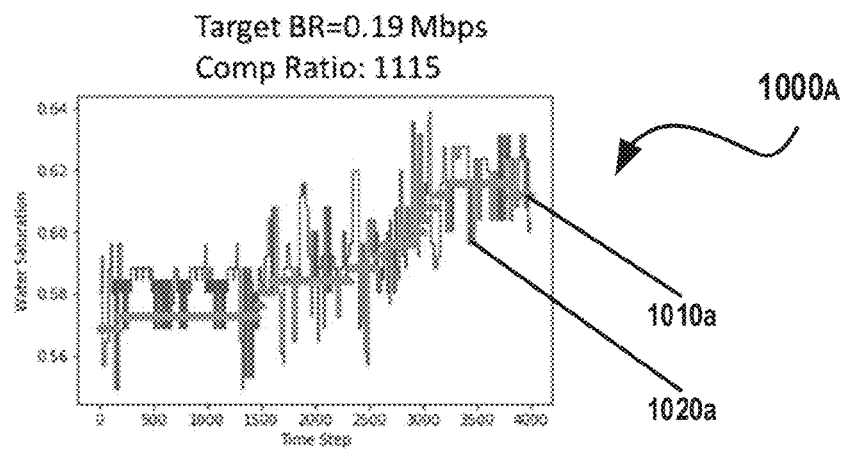
FIGS. 10A-10C show graphs in accordance with one or more embodiments.
Figure 10B:
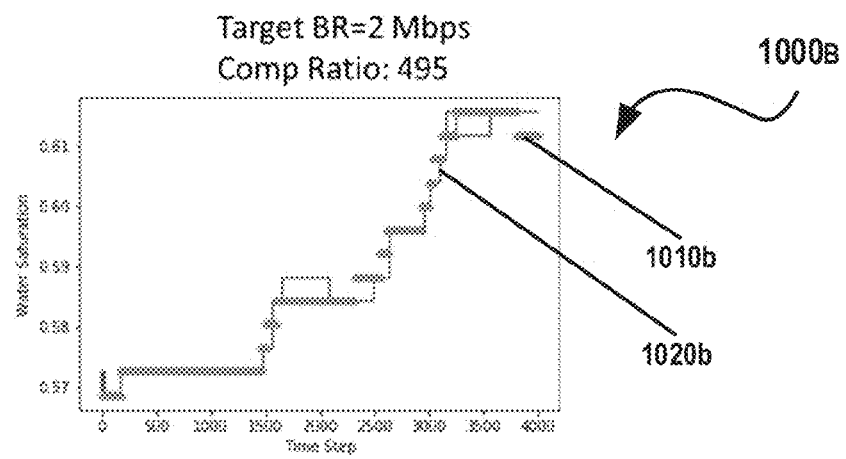
Figure 10C:
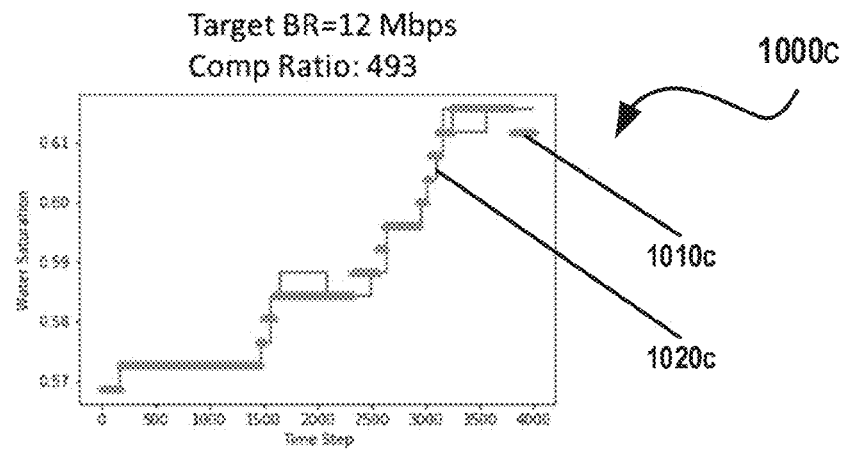

FIGS. 10A-10C show oil saturation evolution of a gridblock (pixel) with time during the simulation with the original value (extracted from bmp images) shown in orange. FIG. 10A shows that a more aggressive compression (e.g., 1115 compression ratio) introduces more noise in the resulting images. FIGS. 10B and 10C show that the resulting images remain almost unchanged when the target bit rates are specified above the aforementioned threshold (i.e., Target CBR 2 vs Target CBR 12).

Figure 11A:
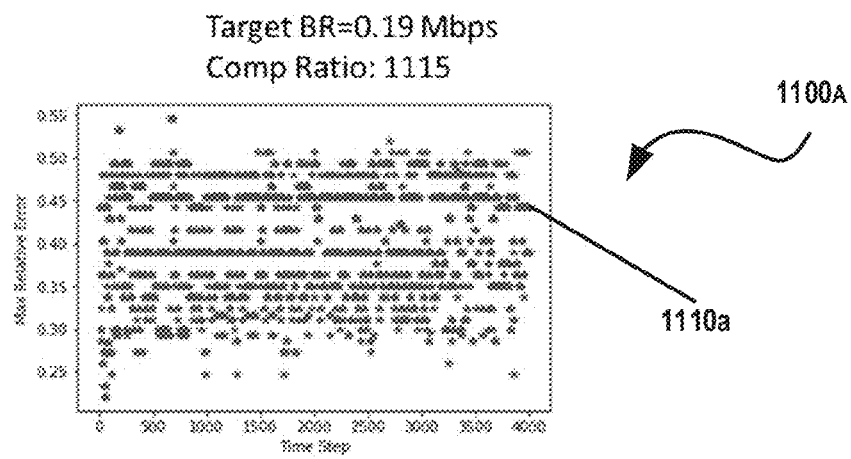
FIGS. 11A-11C show graphs in accordance with one or more embodiments.
Figure 11B:
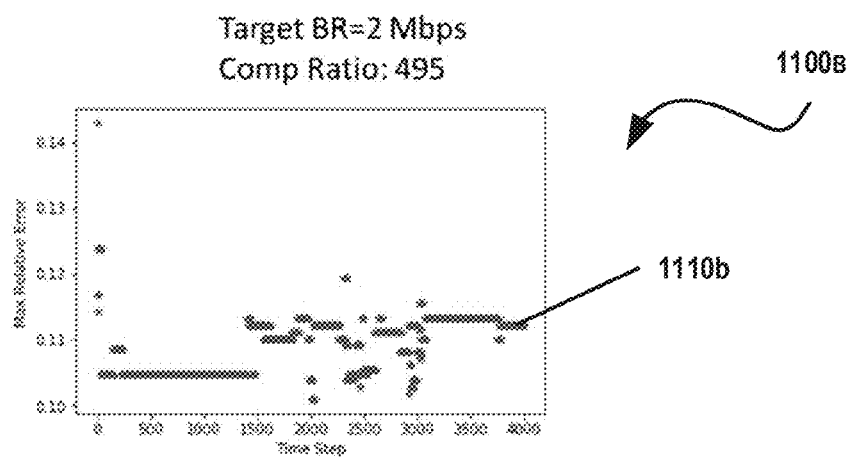
Figure 11C:
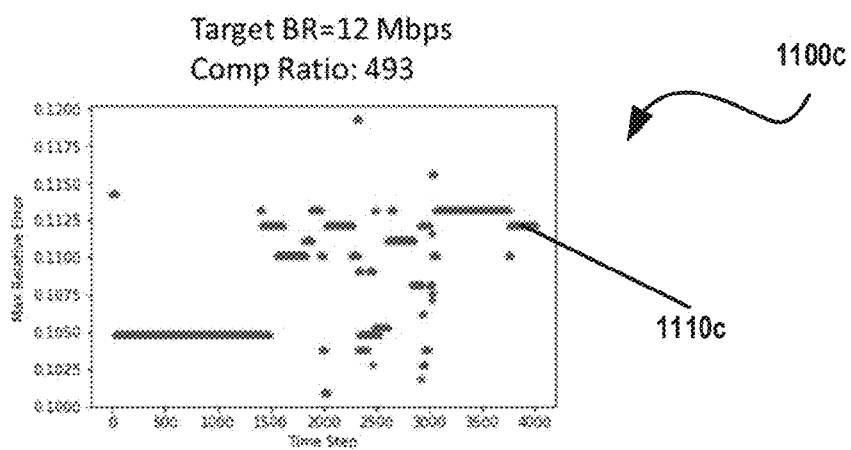

FIGS. 11A-11C shows the maximum relative error for three different compression ratios. Higher compression ratios lead to larger maximum errors and wider spread.

Figure 12:
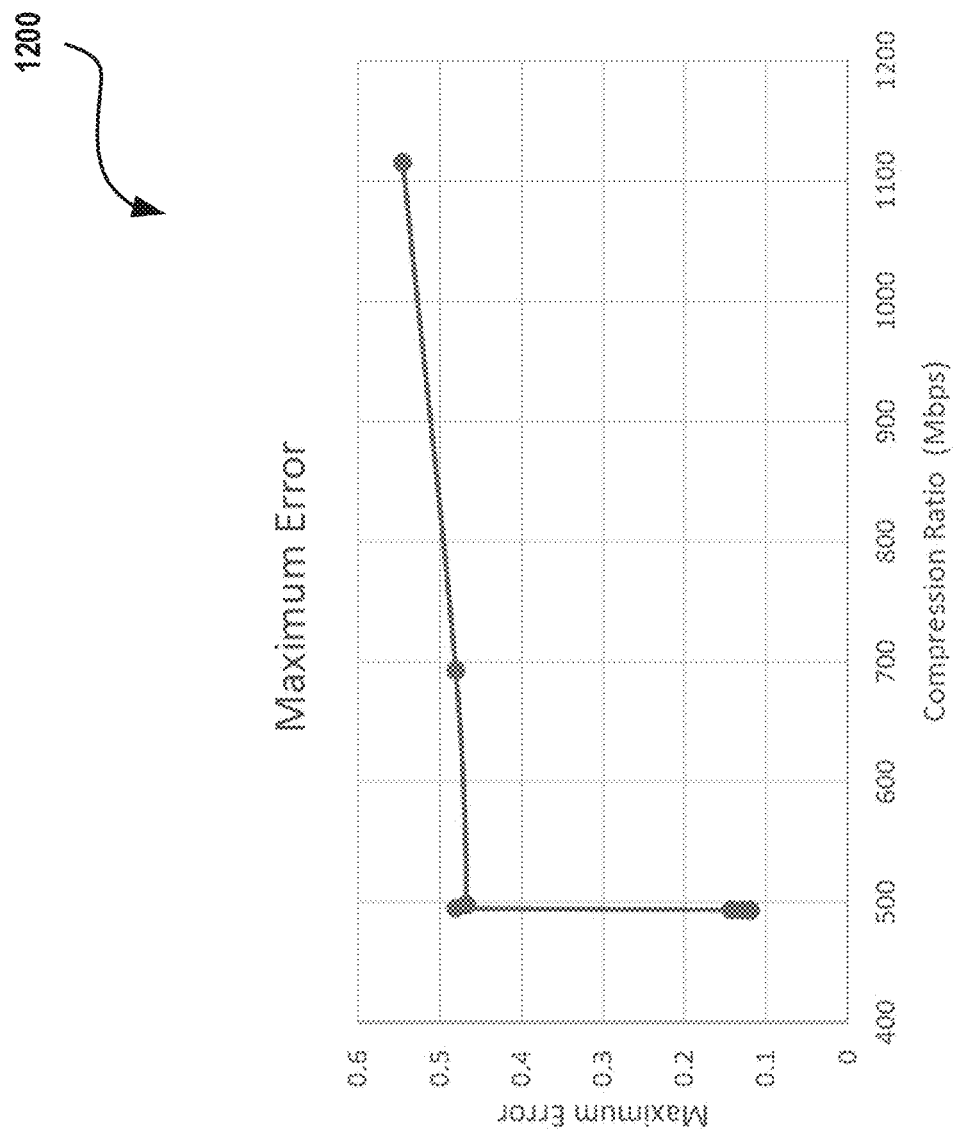
FIG. 12 shows a graph in accordance with one or more embodiments.

FIG. 12 shows timesteps maximum errors in relation to corresponding compression ratios. Higher compression ratios lead to larger maximum errors and wider spread.

Figure 13:
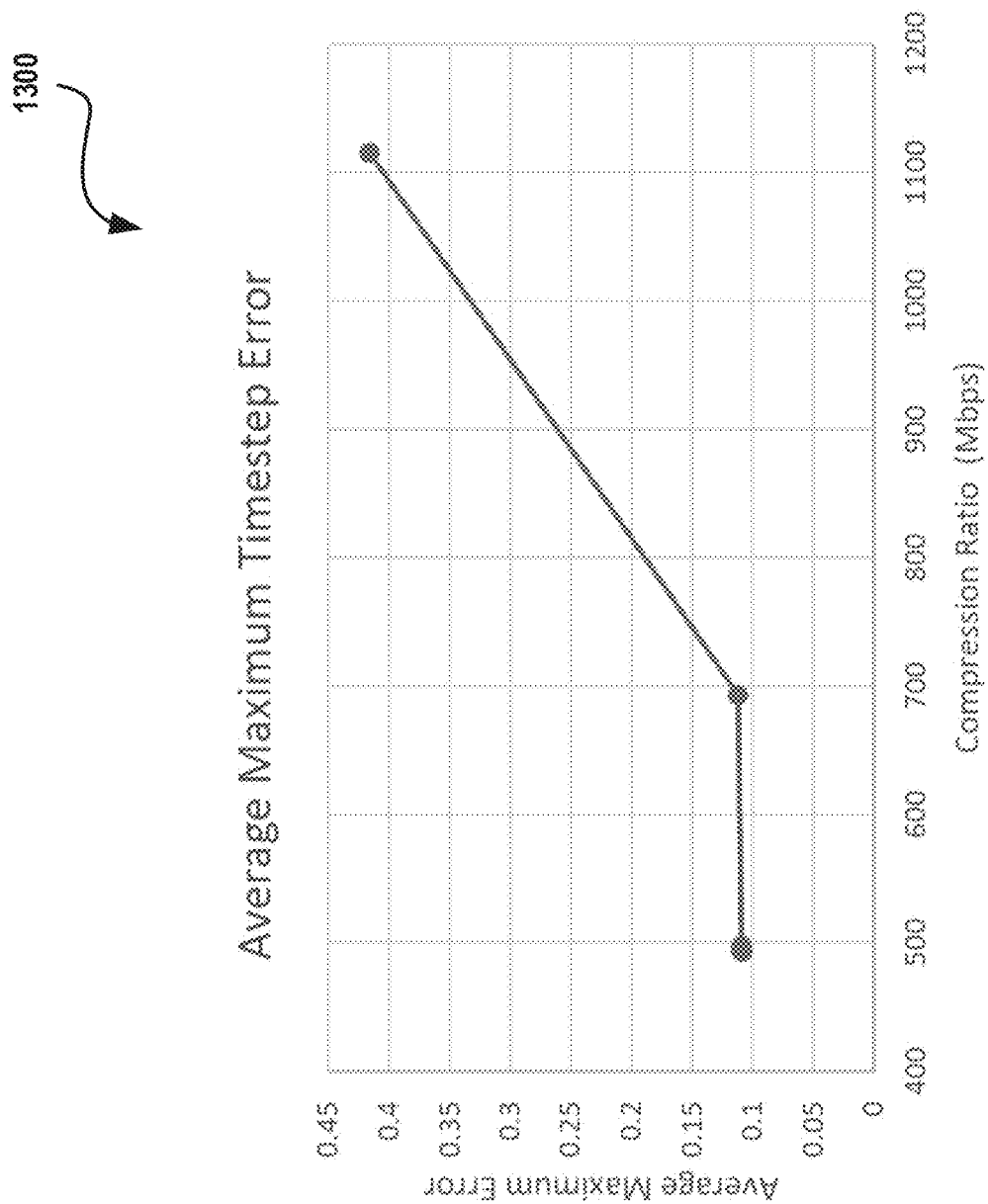
FIG. 13 shows a graph in accordance with one or more embodiments.

FIG. 13 shows average maximum timestep errors in relation to corresponding compression ratios. Higher compression ratios lead to larger maximum errors and wider spread.

Figure 14A:
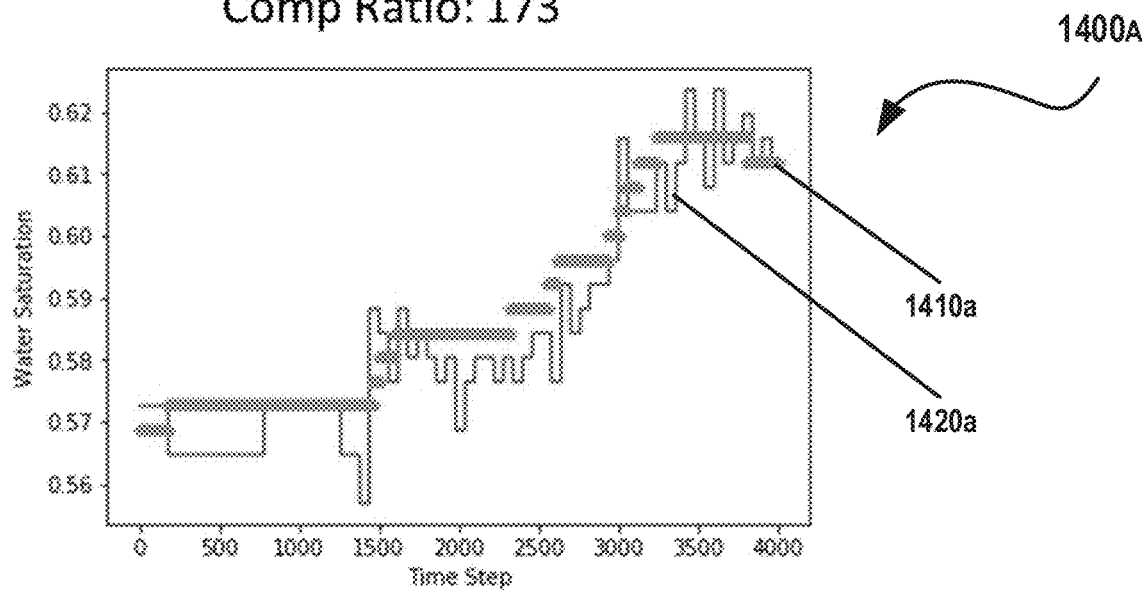
FIGS. 14A and 14B show graphs in accordance with one or more embodiments.
Figure 14B:
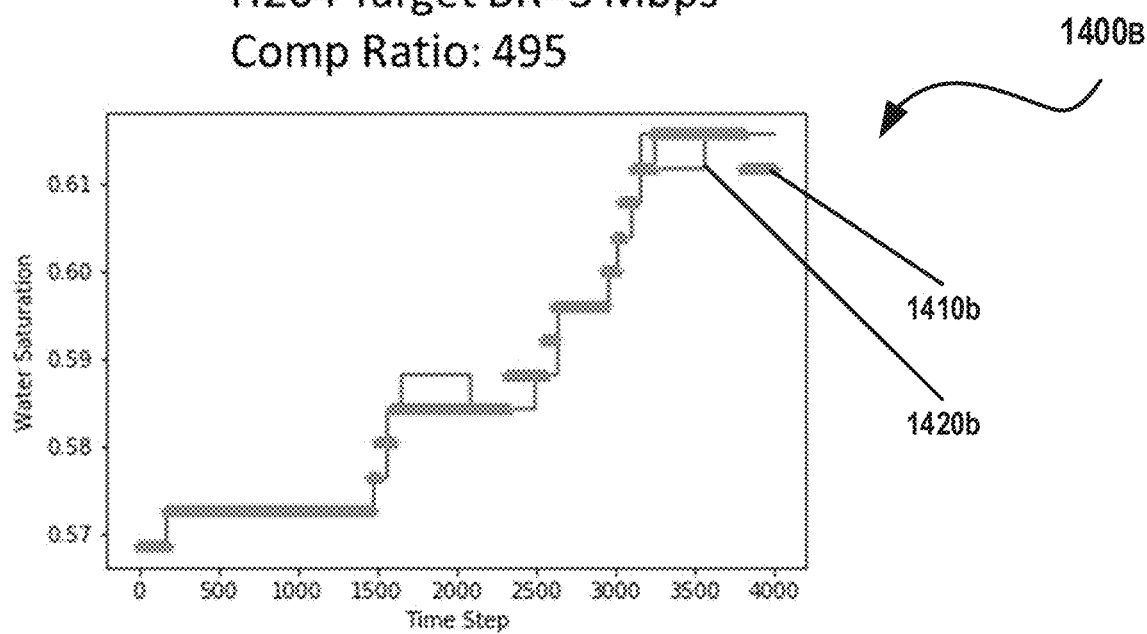

FIGS. 14A and 14B shows examples of H.264 encoding and H.265 encoding according to one or more embodiments. Errors and compression ratio are summarized in Table 3 for comparing the encoding algorithms at a target constant bit rate of 3 Mbps. Results shown that H.264 achieved better compression ratio while maintaining a smaller overall error. To this point, FIGS. 14A and 14B shows the saturation evolution for a gridblock over the simulation run. Compression using encoding H.265 under-predicts the saturation values leading to a larger error. While Table 3 describes testing with respect to H.264 encoding and H.265 encoding, other algorithms may be used interchangeably.

TABLE 3

| Bit Rate (Mbps) | Format | mean (max($e_{ts}$)) | max (max($e_{ts}$)) | RMSE | Video Size | Compression Ratio |
|---|---|---|---|---|---|---|
| 3 | H.264 | 0.1088 | 0.1299 | 0.0002 | 44.1 | 493 |
| 3 | H.265 | 0.1571 | 0.1688 | 0.0002 | 126 | 173 |

Figure 15A:
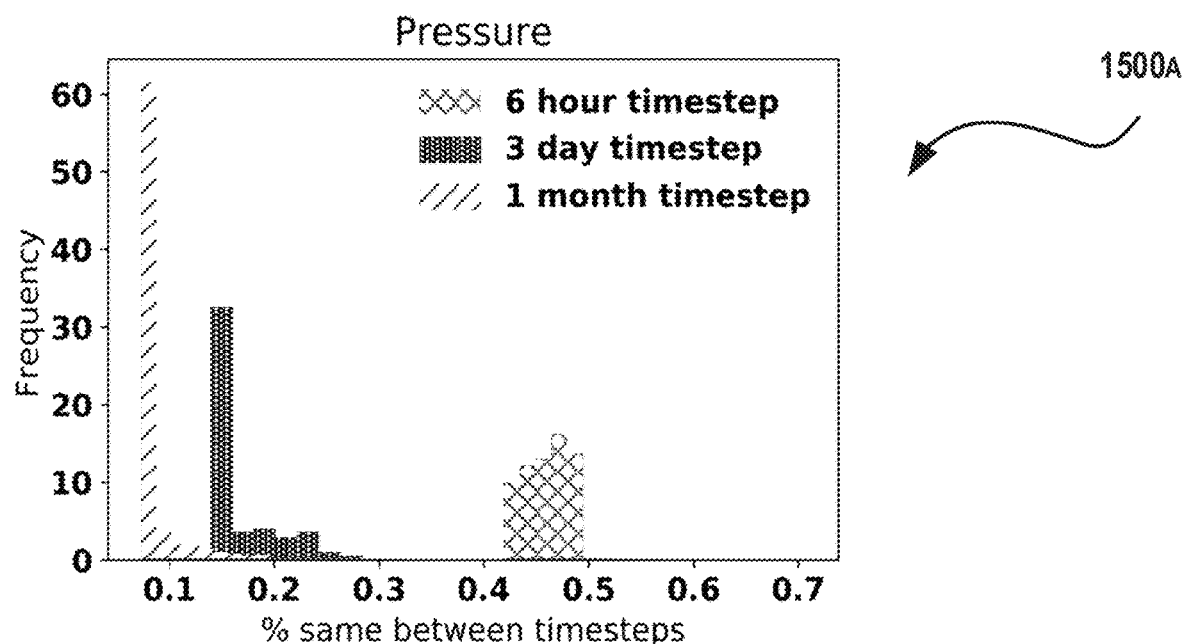
FIGS. 15A and 15B show diagrams in accordance with one or more embodiments.
Figure 15B:
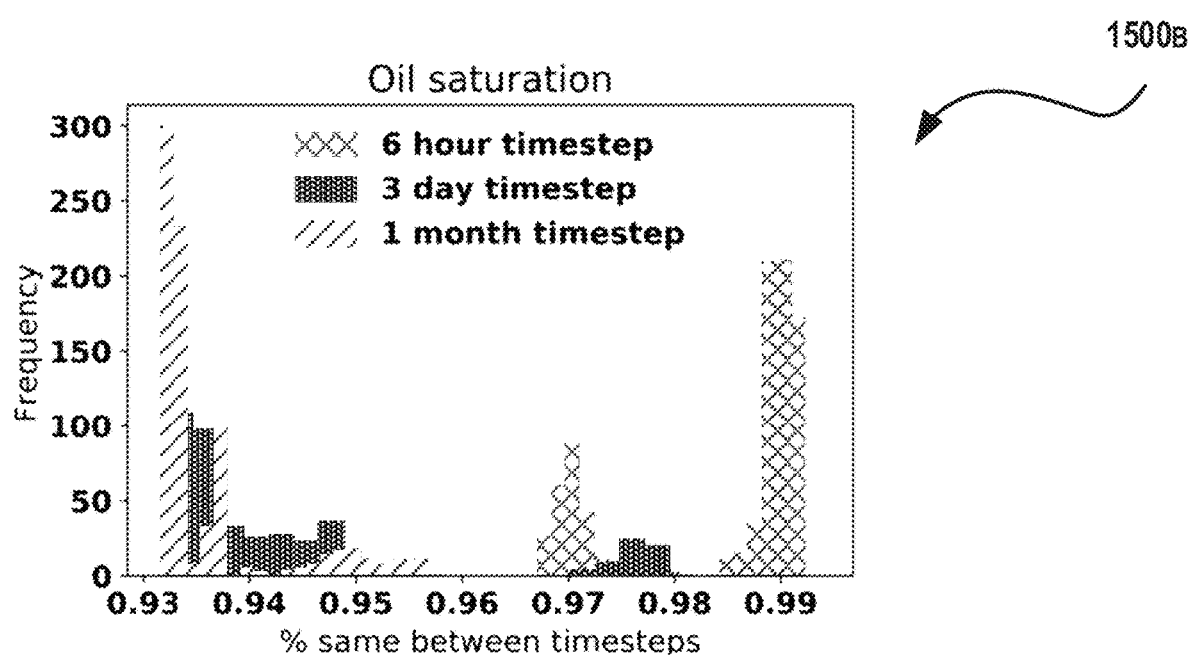

FIGS. 15A and 15B show histograms relating to a percentage of cells with exactly a same value between consecutive timesteps with varying timestep size for pressure and oil saturation, respectively. FIGS. 15A and 15B show frequency changes in the of timesteps at three distinct and different output frequencies: 6 hours, 3 days, and 1 month corresponding to a simulation period, respectively. The changes are quantified by the number of values identical between consecutive timesteps. In the simulation results tallied in FIGS. 15A and 15B, the higher the output frequency, the smaller the changes between consecutive timesteps. For oil saturation, at 6-hour frequency, the number of cells that do not change between frames is around ~98.5%. This percentage decreases as the timestep is increased to 3-day timesteps to around ~94% and ~93.5% for 1-month timesteps. Further, changes in pressure are not as gradual and the percentages of same cells are respectively ~45%, ~18% and ~7% for the same intervals of 6-hours, 3-days, and 1-month. FIGS. 15A and 15B illustrate that, the more frequent the output, the more cells are invariant (i.e. the frames are closer to "identical"). Advantageously, as the more similarities between the frames exist, the better the video compression algorithms are expected to work. The aforementioned may apply to any frequencies used (i.e., same principles apply to frequencies smaller than 1 hour and to frequencies larger than 1 week and any frequency in between).

Figure 16:
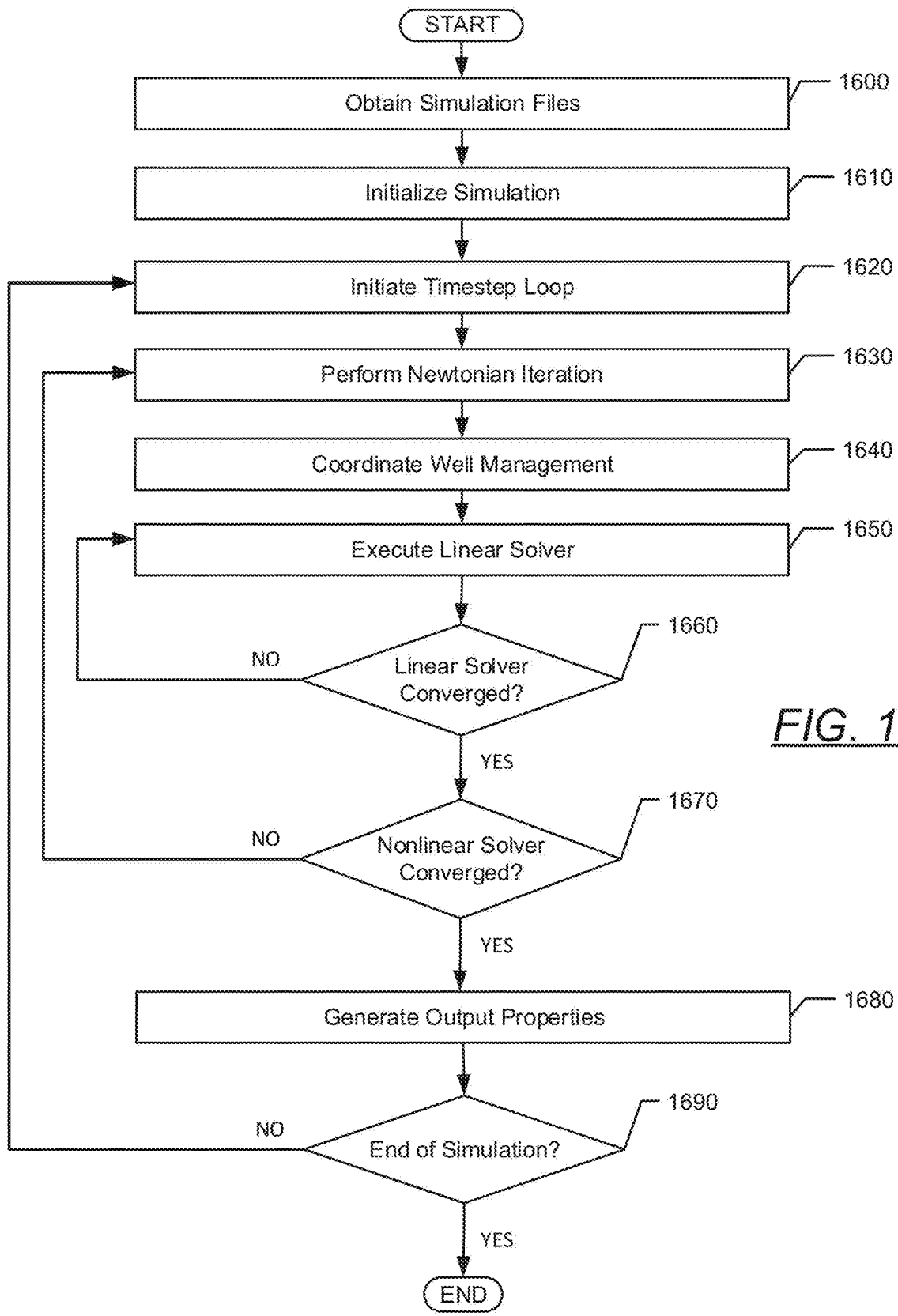
FIG. 16 shows a flow chart in accordance with one or more embodiments.

FIG. 16 shows a flowchart illustrating a method for reducing output of reservoir simulation data. For example, a reservoir simulator may execute a video compression algorithm in which files obtained relating to one or more reservoir simulations may be processed to reduce their storage footprint. The files may be reduced following video compression schemes as described with respect to FIGS. 1-15. Specifically, video compression may be incorporated as part of a conventional reservoir simulation workflow.

In block 1600, output properties are obtained from various files relating to the reservoir. In this case, all files relating to a reservoir simulation are read and analyzed to extract output properties required for interpretation of the compressed video frames.

In block 1610, the simulation is initialized before starting a timestep loop. The timestep loop drives sets the parameters of the simulation by determining a starting date of the simulation, an ending date of the simulation, a size of the timesteps to be taken depending on pressure and saturation changes, convergence characteristics, and a required output at any given time. The timestep loop consists of a number of Newtonian (i.e., nonlinear) iterations and outputting properties.

In block 1620, the timestep loop is started and repeats until the simulation ends. At this stage, it is determined the current video frame being generated and a progression of the simulation based on the parameters set in block 1610.

In block 1630, the Newtonian iteration is performed until the nonlinear solver converges. The Newtonian iterations consist of well management and a number of testing procedures performed by the linear solver.

In block 1640, well management is coordinated based on the Newtonian iteration results. That is, outputting properties will be checked repeatedly during the simulation at a maximum frequency for every timestep.

In block 1650, the linear solver is executed until the linear solver determines that desired parameters are met and the data required converges.

In block 1660, it is determined whether the parameters handled by the linear have converged. Specifically, it is determined whether the parameters set have met their expected, or required, linear output. The loop repeats until the linear output is met. Thus, if there is no convergence, the loop repeats. Alternatively, the process continues.

In block 1670, it is determined whether the parameters handled by the nonlinear have converged. Specifically, it is determined whether the parameters set have met their expected, or required, nonlinear output. The loop repeats until the nonlinear output is met. Each time the loop repeats the Newtonian iteration must be started. Thus, if there is no convergence, the loop repeats. Alternatively, the process continues.

In block 1680, the output properties are generated based the convergence results.

In block 1690, it is determined whether the simulation has come to an end. This is achieved by comparing the parameters set with the parameters at a current state of the reservoir simulation. If the simulation has met the parameters set, then the process ends. Otherwise, the timestep loop continues.

Figure 17:
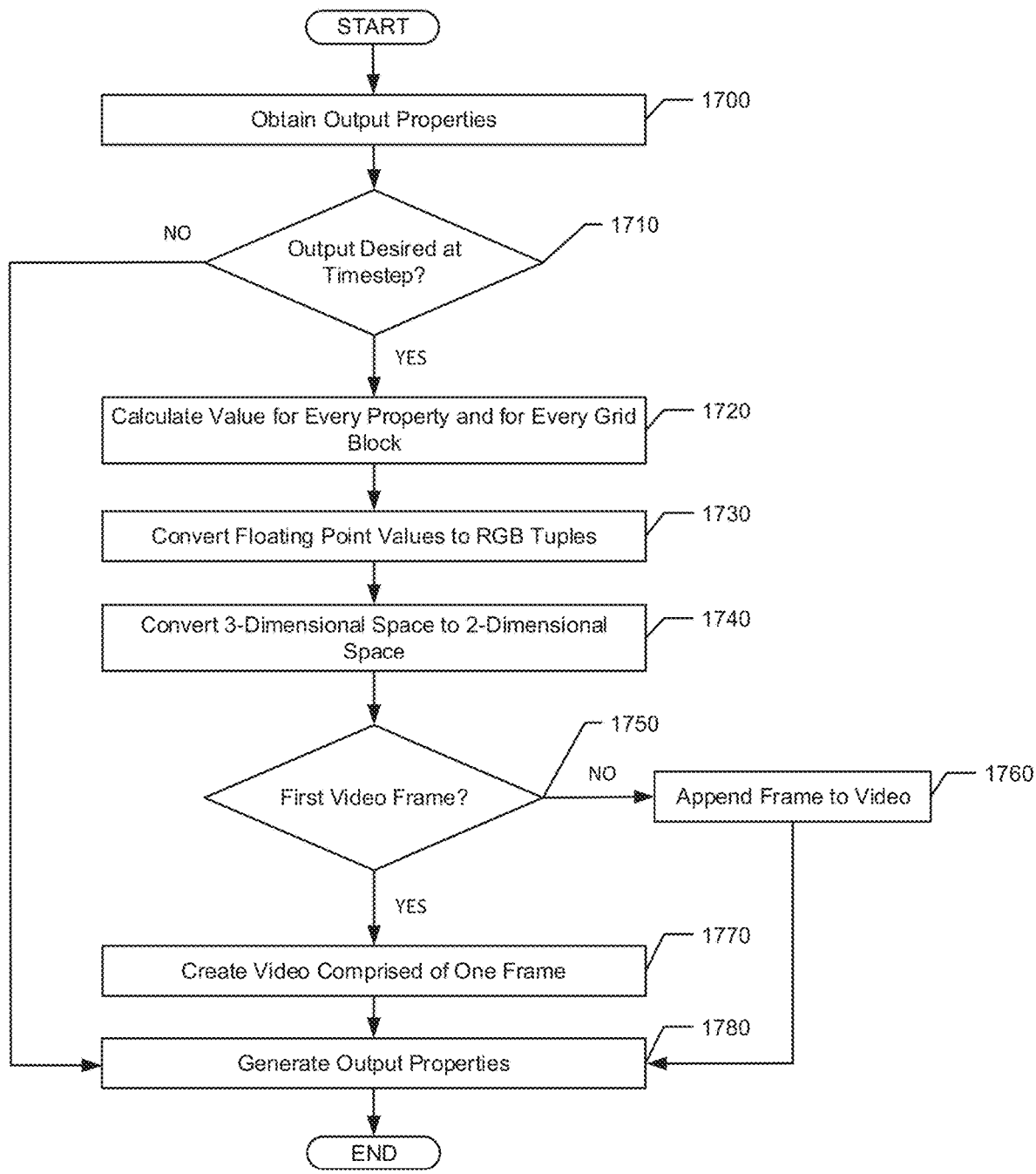
FIG. 17 shows a flow chart in accordance with one or more embodiments.

FIG. 17 shows a flowchart illustrating a method for determining a number of output video frames. For example, a reservoir simulator may execute a video compression algorithm in which files obtained relating to one or more reservoir simulations may be processed to determine a number of video frames in a timestep. The files may be reduced following video compression schemes as described with respect to FIGS. 1-15.

In block 1700, output properties are obtained from various files relating to the reservoir. In this case, all files relating to a reservoir simulation are read and analyzed to extract output properties required for interpretation of the compressed video frames. In another case, the files are received directly from a memory storage in the reservoir simulator as the reservoir simulator runs.

In block 1710, it is determined whether an output is desired at a timestep. The routine is called every time the output is possible but the properties are only written to disk at intervals specified by user (e.g., 1 day, 1 month, etc.). If the output is not desired at this time, the routine is exited. If needed, two different output frequencies can be indicated, one for the conventional output (less frequent) and one for the compressed output (more frequent).

In block 1720, a value for every output property and for every grid block is calculated. If the output is desired at this timestep, a value is calculated for every property and every grid block in the model (number of properties×x-dimension×y-dimension×z-dimension). This can be thought of as a multidimensional array (number of properties)×(x dimension)×(y dimension)×(z dimension). Until now, all the blocks are identical to those of a reservoir simulator with conventional output procedures.

In block 1730, a floating point values are converted to RGB tuples. That is, a floating point (pressure, saturation etc.) or integer (e.g. front advancement mask, fracture activation) value is converted to an RGB tuple. In order for reservoir simulation files to utilize video compression, two conversions need to done. The first conversion is from integer and floating point value to RGB, and the second entails converting 3D data to 2D.

In block 1740, 3D space is converted to 2D space. If the reservoir simulation models are 3D, a mapping between 3D and 2D spaces may be used. One of the solutions that can be used is to place each layer of the model next to each other creating a 2-dimensional representation showing (i.e., X-dimension*layers and Y-dimension). In some embodiments, each layer may have its own separated video, and the video may be stitched together at the end of the simulation.

In block 1750, it is determined whether the video frame is a first video frame. The conversion achieved by the above blocks converts every property at each timestep to a 2D image that is equivalent to one frame of a video.

In block 1760, a created frame is appended to an existing video. Representing 15 layers of oil saturation of a model mapped to 2D, the algorithm decides if the created image should generate a new video (e.g., at the first output block) or should be attached to an existing video. Alternatively, the algorithm may decide to buffer a given number of frames if the compression algorithm requires it (e.g., if the compression algorithm uses future information in the current frame).

In block 1770, a one-frame long video is created. In the case where no previous frames for the given property exist, the video is created and all metadata is initialized (video size, frames per second, file name, etc.). If a video of the property already exists, then the current frame is encoded/compressed and appended to the video as in block 1760.

In block 1780, the output properties are generated based the convergence results.

Figure 18:
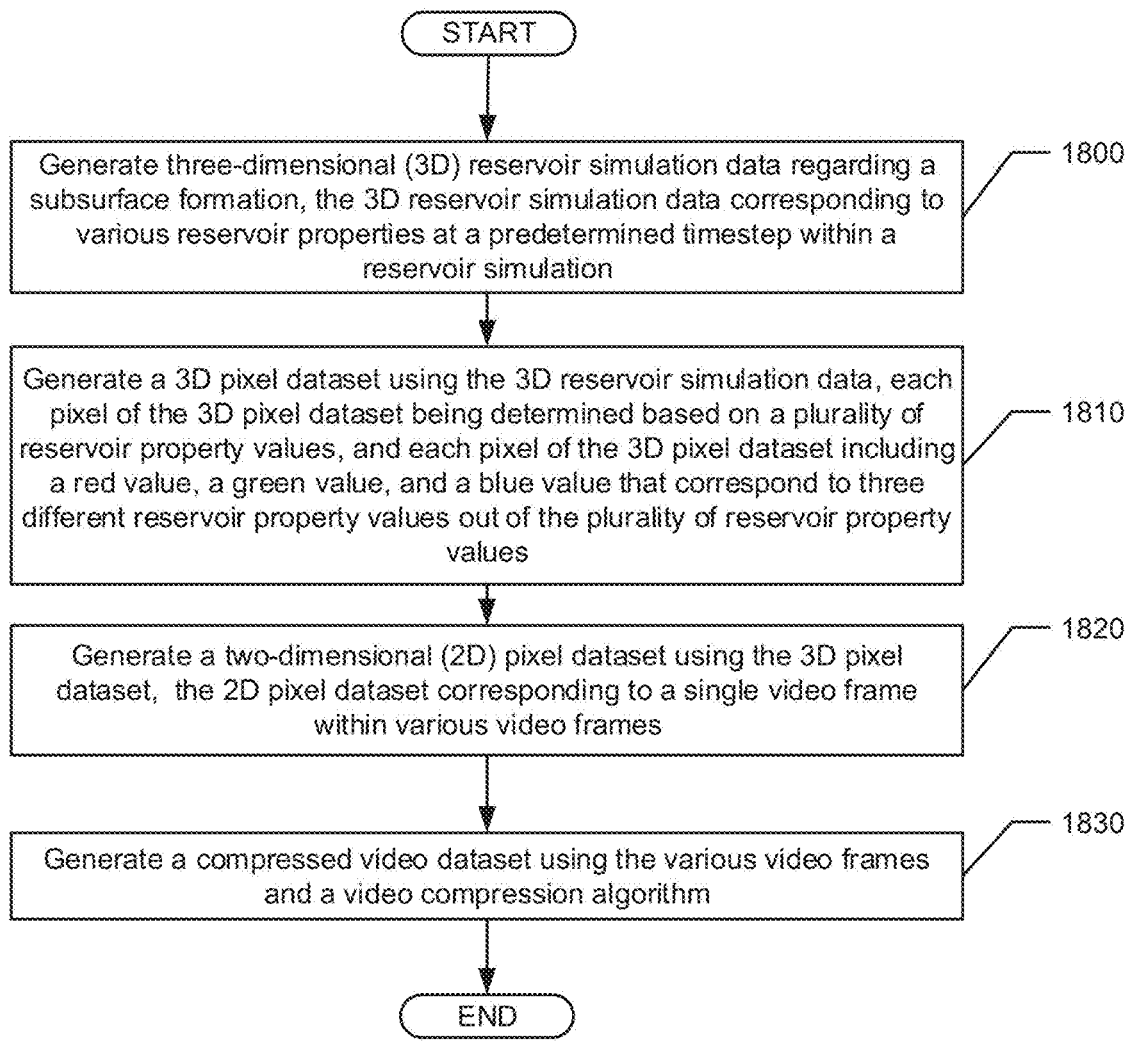
FIG. 18 shows a flow chart in accordance with one or more embodiments.

FIG. 18 shows a flowchart illustrating a method for reducing output of reservoir simulation data. For example, a reservoir simulator may execute a video compression algorithm in which files obtained relating to one or more reservoir simulations may be processed to reduce their storage footprint. The files may be reduced following video compression schemes as described with respect to FIGS. 1-15.

In block 1800, the reservoir simulator generates 3D reservoir simulation data regarding a subsurface formation. The 3D reservoir simulation data corresponds to various reservoir properties at a predetermined timestep within a reservoir simulation. Video compression concepts can be utilized to effectively reduce the size of data outputted in reservoir simulation. The proposed approach capitalizes on many parallels between the smooth transitions between video frames and the gradual movement of fluid inside the reservoir. The method has been tested on several real-field as well as synthetic reservoir models. The compression ratios that have been achieved are high and the efficiency of the method has been found to generally be inversely proportional to the frequency of the outputted data. In addition, the property being outputted plays a role in the efficiency of the compression. During experiments, properties related to the saturation of oil, water and gas yielded the lowest relative error and a higher compression ratio.

In block 1810, the reservoir simulator generates a 3D pixel dataset using the 3D reservoir simulation data. Each pixel of the 3D pixel dataset is determined based on a plurality of reservoir property values. Further, each pixel of the 3D pixel dataset includes a red value, a green value, and a blue value that may correspond to three different properties of a reservoir model. For example, the values may correspond to an oil value, a water value, and a gas value, respectively. The invention capitalizes on the application of video compression algorithms to compress the data at a very high compression ratio while keeping the error limited. The method results in the capability of being able to preview or analyze data without the need to decompress it as it is stored as a video file. This also results in reducing the storage requirements of the output files to a fraction of its original size enabling personnel to store the results of more simulation runs while reducing storage costs.

In block 1820, the reservoir simulator generates a 2D pixel dataset using the 3D pixel dataset. The 2D pixel dataset corresponding to a single video frame within various video frames. Reservoir simulation full-field models are represented on grids that can range from millions to billions of cells. In parallel reservoir simulation, massively sized files are typically written recurrently throughout a simulation run. The files are the simulator's internal files that are a binary representation of multiple properties representing the reservoir state at a chosen time. These files can be used by end users to analyze the reservoir properties over time, to quality control the simulation runs or even to resume the simulation from an arbitrary point in time (restart files). The resulting output files can grow to massive sizes which can reach hundreds of terabytes. Apart from increasing the spatial resolution of simulation models, the frequency of the output can also increase as the input data and controls become more refined which is equivalent to increasing the temporal resolution.

In Block 1830, the reservoir simulator generates a compressed video dataset using the various video frames and a video compression algorithm. Reducing the size of the outputted files leads to savings on storage requirements and even a possible reduction in application runtime. In order to save storage space, engineers typically reduce the frequency of the output, sacrificing temporal resolution.

Figure 19A:
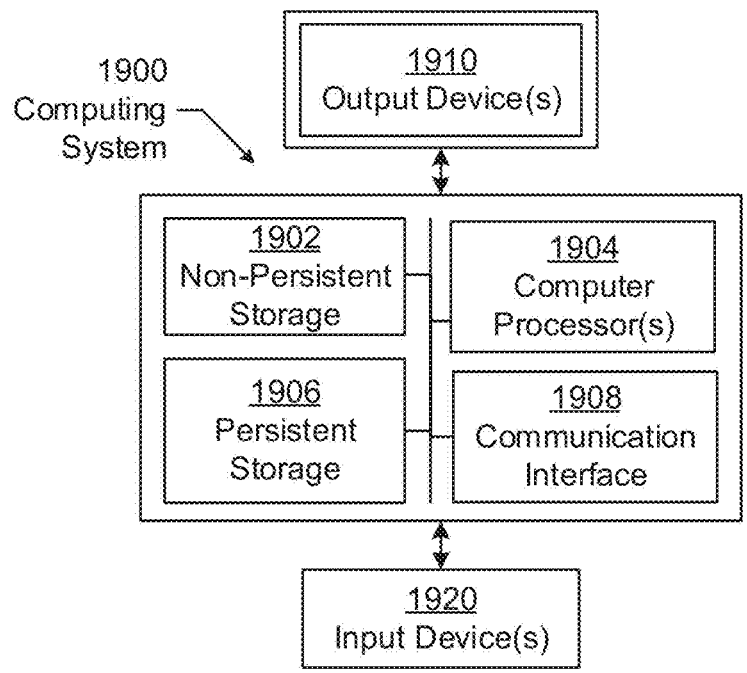
FIGS. 19A and 19B show an example of a computer system and a network system in accordance with one or more embodiments.
Figure 19B:
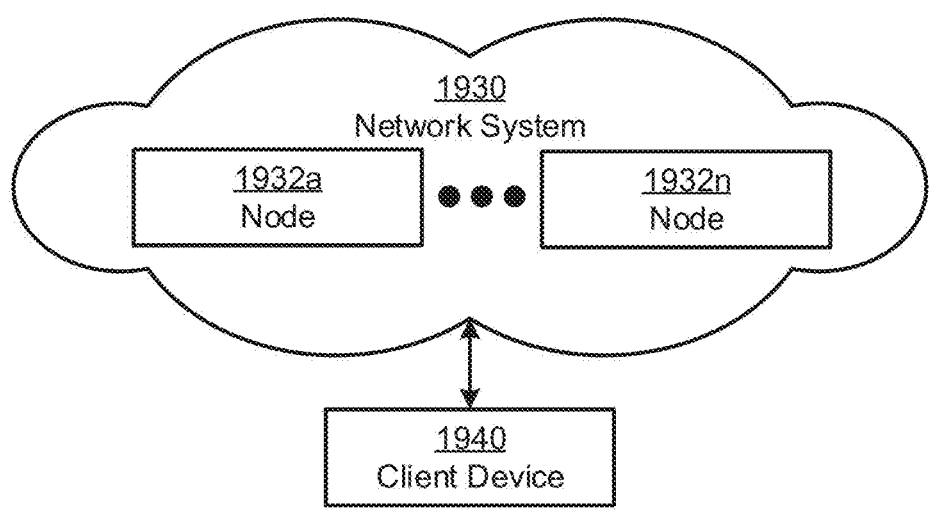

In FIGS. 19A and 19B, embodiments of the invention may be implemented on virtually any type of computing system, regardless of the platform being used. For example, the computing system may be one or more mobile devices (e.g., laptop computer, smart phone, personal digital assistant, tablet computer, or other mobile device), desktop computers, servers, blades in a server chassis, or any other type of computing device or devices that includes at least the minimum processing power, memory, and input and output device(s) to perform one or more embodiments of the invention. For example, as shown in FIG. 19A, the computing system 1900 may include one or more computer processor(s) 1904, non-persistent storage 1902 (e.g., random access memory (RAM), cache memory, flash memory, etc.), one or more persistent storage (1906) (e.g., a hard disk, an optical drive such as a compact disk (CD) drive or digital versatile disk (DVD) drive, a flash memory stick, etc.), and numerous other elements and functionalities. The computer processor(s) 1904 may be an integrated circuit for processing instructions. For example, the computer processor(s) 1904 may be one or more cores, or micro-cores of a processor. The computing system 1900 may also include one or more input device(s) 1920, such as a touchscreen, keyboard, mouse, microphone, touchpad, electronic pen, or any other type of input device. Further, the computing system 1900 may include one or more output device(s) 1910, such as a screen (e.g., a liquid crystal display (LCD), a plasma display, touchscreen, cathode ray tube (CRT) monitor, projector, or other display device), a printer, external storage, or any other output device. One or more of the output device(s) may be the same or different from the input device(s). The computing system 1900 may be connected to a network system 1930 (e.g., a local area network (LAN), a wide area network (WAN) such as the Internet, mobile network, or any other type of network) via a network interface connection (not shown). Many different types of computing systems exist, and the aforementioned input and output device(s) may take other forms.

Software instructions in the form of computer readable program code to perform embodiments of the invention may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that when executed by a processor(s), is configured to perform embodiments of the invention.

Further, one or more elements of the aforementioned computing system 1900 may be located at a remote location and be connected to the other elements over a network system 1930. Further, one or more embodiments of the invention may be implemented on a distributed system having various nodes, where each portion of the invention may be located on a different node within the distributed system. In one embodiment of the invention, the node corresponds to a distinct computing device. Alternatively, the node may correspond to a computer processor with associated physical memory. The node may alternatively correspond to a computer processor or micro-core of a computer processor with shared memory and/or resources.

The computing system 1900 in FIG. 19A may be connected to or be a part of a network. For example, as shown in FIG. 19B, the network system 1930 may include multiple nodes (e.g., node 1932a, node 1932n). Each node may correspond to a computing system, such as the computing system shown in FIG. 19A, or a group of nodes combined may correspond to the computing system shown in FIG. 19A. By way of an example, embodiments of the disclosure may be implemented on a node of a distributed system that is connected to other nodes. By way of another example, embodiments of the disclosure may be implemented on a distributed computing system having multiple nodes, where each portion of the disclosure may be located on a different node within the distributed computing system. Further, one or more elements of the aforementioned computing system 1900 may be located at a remote location and connected to the other elements over a network.

Although not shown in FIG. 19B, the node may correspond to a blade in a server chassis that is connected to other nodes via a backplane. By way of another example, the node may correspond to a server in a data center. By way of another example, the node may correspond to a computer processor or micro-core of a computer processor with shared memory and/or resources.

The nodes (e.g., node 1932a, node 1932n) in the network system 1930 may be configured to provide services for a client device 1940. For example, the nodes may be part of a cloud computing system. The nodes may include functionality to receive requests from the client device 1940 and transmit responses to the client device 1940. The client device 1940 may be a computing system, such as the computing system shown in FIG. 19A. Further, the client device 1940 may include and/or perform all or a portion of one or more embodiments of the disclosure.

The computing system or group of computing systems described in FIGS. 19A and 19B may include functionality to perform a variety of operations disclosed herein. For example, the computing system(s) may perform communication between processes on the same or different systems. A variety of mechanisms, employing some form of active or passive communication, may facilitate the exchange of data between processes on the same device. Examples representative of these inter-process communications include, but are not limited to, the implementation of a file, a signal, a socket, a message queue, a pipeline, a semaphore, shared memory, message passing, and a memory-mapped file. Further details pertaining to a couple of these non-limiting examples are provided below.

Based on the client-server networking model, sockets may serve as interfaces or communication channel endpoints enabling bidirectional data transfer between processes on the same device. Foremost, following the client-server networking model, a server process (e.g., a process that provides data) may create a first socket object. Next, the server process binds the first socket object, thereby associating the first socket object with a unique name and/or address. After creating and binding the first socket object, the server process then waits and listens for incoming connection requests from one or more client processes (e.g., processes that seek data). At this point, when a client process wishes to obtain data from a server process, the client process starts by creating a second socket object. The client process then proceeds to generate a connection request that includes at least the second socket object and the unique name and/or address associated with the first socket object. The client process then transmits the connection request to the server process. Depending on availability, the server process may accept the connection request, establishing a communication channel with the client process, or the server process, busy in handling other operations, may queue the connection request in a buffer until the server process is ready. An established connection informs the client process that communications may commence. In response, the client process may generate a data request specifying the data that the client process wishes to obtain. The data request is subsequently transmitted to the server process. Upon receiving the data request, the server process analyzes the request and gathers the requested data. Finally, the server process then generates a reply including at least the requested data and transmits the reply to the client process. The data may be transferred, more commonly, as datagrams or a stream of characters (e.g., bytes).

Shared memory refers to the allocation of virtual memory space in order to substantiate a mechanism for which data may be communicated and/or accessed by multiple processes. In implementing shared memory, an initializing process first creates a shareable segment in persistent or non-persistent storage. Post creation, the initializing process then mounts the shareable segment, subsequently mapping the shareable segment into the address space associated with the initializing process. Following the mounting, the initializing process proceeds to identify and grant access permission to one or more authorized processes that may also write and read data to and from the shareable segment. Changes made to the data in the shareable segment by one process may immediately affect other processes, which are also linked to the shareable segment. Further, when one of the authorized processes accesses the shareable segment, the shareable segment maps to the address space of that authorized process. Often, one authorized process may mount the shareable segment, other than the initializing process, at any given time.

Other techniques may be used to share data, such as the various data described in the present application, between processes without departing from the scope of the disclosure. The processes may be part of the same or different application and may execute on the same or different computing system.

Rather than or in addition to sharing data between processes, the computing system performing one or more embodiments of the disclosure may include functionality to receive data from a user. For example, in one or more embodiments, a user may submit data via a graphical user interface (GUI) on the user device. Data may be submitted via the graphical user interface by a user selecting one or more graphical user interface widgets or inserting text and other data into graphical user interface widgets using a touchpad, a keyboard, a mouse, or any other input device. In response to selecting a particular item, information regarding the particular item may be obtained from persistent or non-persistent storage by the computer processor. Upon selection of the item by the user, the contents of the obtained data regarding the particular item may be displayed on the user device in response to the user's selection.

By way of another example, a request to obtain data regarding the particular item may be sent to a server operatively connected to the user device through a network. For example, the user may select a uniform resource locator (URL) link within a web client of the user device, thereby initiating a Hypertext Transfer Protocol (HTTP) or other protocol request being sent to the network host associated with the URL. In response to the request, the server may extract the data regarding the particular selected item and send the data to the device that initiated the request. Once the user device has received the data regarding the particular item, the contents of the received data regarding the particular item may be displayed on the user device in response to the user's selection. Further to the above example, the data received from the server after selecting the URL link may provide a web page in Hyper Text Markup Language (HTML) that may be rendered by the web client and displayed on the user device.

Once data is obtained, such as by using techniques described above or from storage, the computing system, in performing one or more embodiments of the disclosure, may extract one or more data items from the obtained data. For example, the extraction may be performed as follows by the computing system 1900 in FIG. 19A. First, the organizing pattern (e.g., grammar, schema, layout) of the data is determined, which may be based on one or more of the following: position (e.g., bit or column position, Nth token in a data stream, etc.), attribute (where the attribute is associated with one or more values), or a hierarchical/tree structure (consisting of layers of nodes at different levels of detail—such as in nested packet headers or nested document sections). Then, the raw, unprocessed stream of data symbols is parsed, in the context of the organizing pattern, into a stream (or layered structure) of tokens (where each token may have an associated token "type").

Next, extraction criteria are used to extract one or more data items from the token stream or structure, where the extraction criteria are processed according to the organizing pattern to extract one or more tokens (or nodes from a layered structure). For position-based data, the token(s) at the position(s) identified by the extraction criteria are extracted. For attribute/value-based data, the token(s) and/or node(s) associated with the attribute(s) satisfying the extraction criteria are extracted. For hierarchical/layered data, the token(s) associated with the node(s) matching the extraction criteria are extracted. The extraction criteria may be as simple as an identifier string or may be a query presented to a structured data repository (where the data repository may be organized according to a database schema or data format, such as XML).

The extracted data may be used for further processing by the computing system. For example, the computing system of FIG. 19A, while performing one or more embodiments of the disclosure, may perform data comparison. Data comparison may be used to compare two or more data values (e.g., A, B). For example, one or more embodiments may determine whether A>B, A=B, A!=B, A<B, etc. The comparison may be performed by submitting A, B, and an opcode specifying an operation related to the comparison into an arithmetic logic unit (ALU) (i.e., circuitry that performs arithmetic and/or bitwise logical operations on the two data values). The ALU outputs the numerical result of the operation and/or one or more status flags related to the numerical result. For example, the status flags may indicate whether the numerical result is a positive number, a negative number, zero, etc. By selecting the proper opcode and then reading the numerical results and/or status flags, the comparison may be executed. For example, in order to determine if A>B, B may be subtracted from A (i.e., A−B), and the status flags may be read to determine if the result is positive (i.e., if A>B, then A−B>0). In one or more embodiments, B may be considered a threshold, and A is deemed to satisfy the threshold if A=B or if A>B, as determined using the ALU. In one or more embodiments of the disclosure, A and B may be vectors, and comparing A with B includes comparing the first element of vector A with the first element of vector B, the second element of vector A with the second element of vector B, etc. In one or more embodiments, if A and B are strings, the binary values of the strings may be compared.

The computing system in FIG. 19A may implement and/or be connected to a data repository. For example, one type of data repository is a database. A database is a collection of information configured for ease of data retrieval, modification, re-organization, and deletion. Database Management System (DBMS) is a software application that provides an interface for users to define, create, query, update, or administer databases.

The user, or software application, may submit a statement or query into the DBMS. Then the DBMS interprets the statement. The statement may be a select statement to request information, update statement, create statement, delete statement, etc. Moreover, the statement may include parameters that specify data, or data container (database, table, record, column, view, etc.), identifier(s), conditions (comparison operators), functions (e.g. join, full join, count, average, etc.), sort (e.g. ascending, descending), or others. The DBMS may execute the statement. For example, the DBMS may access a memory buffer, a reference or index a file for read, write, deletion, or any combination thereof, for responding to the statement. The DBMS may load the data from persistent or non-persistent storage and perform computations to respond to the query. The DBMS may return the result(s) to the user or software application.

The computing system of FIG. 19A may include functionality to present raw and/or processed data, such as results of comparisons and other processing. For example, presenting data may be accomplished through various presenting methods. Specifically, data may be presented through a user interface provided by a computing device. The user interface may include a GUI that displays information on a display device, such as a computer monitor or a touchscreen on a handheld computer device. The GUI may include various GUI widgets that organize what data is shown as well as how data is presented to a user. Furthermore, the GUI may present data directly to the user, e.g., data presented as actual data values through text, or rendered by the computing device into a visual representation of the data, such as through visualizing a data model.

For example, a GUI may first obtain a notification from a software application requesting that a particular data object be presented within the GUI. Next, the GUI may determine a data object type associated with the particular data object, e.g., by obtaining data from a data attribute within the data object that identifies the data object type. Then, the GUI may determine any rules designated for displaying that data object type, e.g., rules specified by a software framework for a data object class or according to any local parameters defined by the GUI for presenting that data object type. Finally, the GUI may obtain data values from the particular data object and render a visual representation of the data values within a display device according to the designated rules for that data object type.

Data may also be presented through various audio methods. In particular, data may be rendered into an audio format and presented as sound through one or more speakers operably connected to a computing device.

Data may also be presented to a user through haptic methods. For example, haptic methods may include vibrations or other physical signals generated by the computing system. For example, data may be presented to a user using a vibration generated by a handheld computer device with a predefined duration and intensity of the vibration to communicate the data.

The above description of functions presents only a few examples of functions performed by the computing system of FIG. 19A and the nodes and/or client device in FIG. 19B. Other functions may be performed using one or more embodiments of the disclosure.

While the disclosure has been described with respect to a limited number of embodiments, those skilled in the art, having benefit of this disclosure, will appreciate that other embodiments can be devised which do not depart from the scope of the disclosure as disclosed herein. Accordingly, the scope of the disclosure should be limited only by the attached claims.

What is claimed is:

1. A method, comprising:
disposing a well control system in a well environment to control operations of a well system, wherein the well control system comprises a reservoir simulator that processes and stores reservoir information of a reservoir by at least:
generating three-dimensional (3D) reservoir simulation data regarding a subsurface formation, wherein the 3D reservoir simulation data corresponds to a plurality of reservoir properties at a predetermined timestep within a reservoir simulation;
generating a 3D pixel dataset using the 3D reservoir simulation data,
wherein each pixel of the 3D pixel dataset is determined based on a plurality of reservoir property values, and
wherein each pixel of the 3D pixel dataset comprises a red value, a green value, and a blue value that corresponds to three different reservoir property values out of the plurality of reservoir property values;
converting the 3D pixel dataset into a two-dimensional (2D) pixel dataset, wherein the 2D pixel dataset corresponds to a single video frame within a plurality of video frames; and
generating a compressed video dataset using the plurality of video frames and a video compression algorithm; and
facilitating, using the well system, extraction of hydrocarbons from the reservoir,
wherein a storage footprint of the well control system is reduced by at least said generating the compressed video dataset.

2. The method of claim 1, further comprising:
identifying a plurality of files associated with the reservoir simulation;
scanning every file out of the plurality of files;
estimating a time duration of the reservoir simulation based on the plurality of files scanned; and
obtaining the plurality of reservoir properties values from the plurality of files scanned,
wherein the 3D reservoir simulation data comprises a value indicating a number of the plurality of files, the time duration, and the plurality of reservoir property values.

3. The method of claim 2, further comprising:
determining a size of the predetermined timestep based on the plurality of reservoir properties, the size of the predetermined timestep being based on the time duration estimated;
determining convergence characteristics and outputting properties for the reservoir simulation, the outputting properties comprising a total number of timesteps in the reservoir simulation; and
performing non-linear iterations to generate the 2D pixel dataset, the non-linear iterations comprising validating 3D reservoir simulation data well management system and solving the non-linear iterations with a linear solver,
wherein the plurality of reservoir properties comprises pressure and saturation changes through a reservoir.

4. The method of claim 3,
wherein the single video frame corresponds to a particular timestep within the total number of timesteps.

5. The method of claim 3,
wherein the predetermined timestep is configured to output the reservoir simulation data compressed using two different output frequencies, a first output frequency being a conventional output and a second output frequency being a compressed output.

6. The method of claim 1,
wherein the video compression algorithm is based on interframe compression and an H.264 codec.

7. The method of claim 1, further comprising:
converting the plurality of reservoir properties into floating values; and
interpreting the floating-point values to generate the 3D pixel dataset through interpolation.

8. The method of claim 1, further comprising:
observing the plurality of reservoir properties in a compressed video form.

9. A system, comprising:
a well system in a well environment and configured to facilitate extraction of hydrocarbons from a reservoir; and
a well control system to control operations of the well system, wherein the well control system comprises a reservoir simulator that processes and stores reservoir information of the reservoir by at least:
generating three-dimensional (3D) reservoir simulation data regarding a subsurface formation, wherein the 3D reservoir simulation data corresponds to a plurality of reservoir properties at a predetermined timestep within a reservoir simulation;
generating a 3D pixel dataset using the 3D reservoir simulation data,
wherein each pixel of the 3D pixel dataset is determined based on a plurality of reservoir property values, and
wherein each pixel of the 3D pixel dataset comprises a red value, a green value, and a blue value that corresponds to three different reservoir property values out of the plurality of reservoir property values;
converting the 3D pixel dataset into a two-dimensional (2D) pixel dataset; and
generating a compressed video dataset using the plurality of video frames and a video compression algorithm,
wherein a storage footprint of the well control system is reduced by at least said generating the compressed video dataset.

10. The system of claim 9, wherein the reservoir simulator processes and stores the reservoir information of the reservoir further by:
identifying a plurality of files associated with the reservoir simulation;
scanning every file out of the plurality of files;
estimating a time duration of the reservoir simulation based on the plurality of files scanned; and
obtaining the plurality of reservoir properties values from the plurality of files scanned,
wherein the 3D reservoir simulation data comprises a value indicating a number of the plurality of files, the time duration, and the plurality of reservoir property values.

11. The system of claim 10, wherein the reservoir simulator processes and stores the reservoir information of the reservoir further by:
   determining a size of the predetermined timestep based on the plurality of reservoir properties, the size of the predetermined timestep being based on the time duration estimated;
   determining convergence characteristics and outputting properties for the reservoir simulation, the outputting properties comprising a total number of timesteps in the reservoir simulation; and
   performing non-linear iterations to generate the 2D pixel dataset, the non-linear iterations comprising validating 3D reservoir simulation data well management system and solving the non-linear iterations with a linear solver,
   wherein the plurality of reservoir properties comprise pressure and saturation changes through a reservoir.

12. The system of claim 11,
   wherein the single video frame corresponds to a particular timestep within the total number of timesteps.

13. The system of claim 11,
   wherein the predetermined timestep is configured to output the reservoir simulation data compressed using two different output frequencies, a first output frequency being a conventional output and a second output frequency being a compressed output.

14. The system of claim 9,
   wherein the video compression algorithm is based on interframe compression and an H.264 codec.

15. The system of claim 9, wherein the reservoir simulator processes and stores the reservoir information of the reservoir further by:
   converting the plurality of reservoir properties into floating-point values; and
   interpreting the floating-point values to generate the 3D pixel dataset through interpolation.

16. A non-transitory computer readable medium storing instructions of a reservoir simulator in a well control system, the instructions, when executed by a computer processor, comprising functionality for processing and storing reservoir information of a reservoir by at least:
   generating three-dimensional (3D) reservoir simulation data regarding a subsurface formation, wherein the 3D reservoir simulation data corresponds to a plurality of reservoir properties at a predetermined timestep within a reservoir simulation;
   generating a 3D pixel dataset using the 3D reservoir simulation data,
      wherein each pixel of the 3D pixel dataset is determined based on a plurality of reservoir property values, and
      wherein each pixel of the 3D pixel dataset comprises a red value, a green value, and a blue value that corresponds to three different reservoir property values out of the plurality of reservoir property values;
   converting the 3D pixel dataset into a two-dimensional (2D) pixel dataset; and
   generating a compressed video dataset using the plurality of video frames and a video compression algorithm,
   wherein the well control system controls a well system in a well environment to facilitate extraction of hydrocarbons from the reservoir, and
   wherein a storage footprint of the well control system is reduced by at least said generating the compressed video dataset.

17. The non-transitory computer readable medium of claim 16, the instructions further comprising functionality for:
   identifying a plurality of files associated with the reservoir simulation;
   scanning every file out of the plurality of files;
   estimating a time duration of the reservoir simulation based on the plurality of files scanned; and
   obtaining the plurality of reservoir properties values from the plurality of files scanned,
   wherein the 3D reservoir simulation data comprises a value indicating a number of the plurality of files, the time duration, and the plurality of reservoir property values.

18. The non-transitory computer readable medium of claim 16, the instructions further comprising functionality for:
   determining a size of the predetermined timestep based on the plurality of reservoir properties, the size of the predetermined timestep being based on the time duration estimated;
   determining convergence characteristics and outputting properties for the reservoir simulation, the outputting properties comprising a total number of timesteps in the reservoir simulation; and
   performing non-linear iterations to generate the 2D pixel dataset, the non-linear iterations comprising validating 3D reservoir simulation data well management system and solving the non-linear iterations with a linear solver,
   wherein the plurality of reservoir properties comprise pressure and saturation changes through a reservoir.

19. The non-transitory computer readable medium of claim 16, the instructions further comprising functionality for:
   converting the plurality of reservoir properties into floating-point values; and
   interpreting the floating values to generate the 3D pixel dataset through interpolation.

20. The non-transitory computer readable medium of claim 16, the instructions further comprising functionality for:
   observing the plurality of reservoir properties in a compressed video form.

* * * * *